United States Patent
Forbes et al.

(10) Patent No.: US 7,583,534 B2
(45) Date of Patent: *Sep. 1, 2009

(54) MEMORY UTILIZING OXIDE-CONDUCTOR NANOLAMINATES

(75) Inventors: Leonard Forbes, Corvallis, OR (US); Kie Y. Ahn, Chappaqua, NY (US)

(73) Assignee: Micron Technolgy, Inc., Boise, ID (US)

(*) Notice: Subject to any disclaimer, the term of this patent is extended or adjusted under 35 U.S.C. 154(b) by 256 days.

This patent is subject to a terminal disclaimer.

(21) Appl. No.: 11/217,771

(22) Filed: Aug. 31, 2005

(65) Prior Publication Data

US 2006/0008966 A1  Jan. 12, 2006

Related U.S. Application Data

(62) Division of application No. 10/191,336, filed on Jul. 8, 2002, now Pat. No. 7,221,017.

(51) Int. Cl.
*G11C 16/04* (2006.01)
*G11C 16/06* (2006.01)

(52) U.S. Cl. .................. 365/185.18; 257/314; 257/315; 365/185.05

(58) Field of Classification Search ............ 365/185.18, 365/185.23, 185.24, 185.16, 185.05; 257/314, 257/315
See application file for complete search history.

(56) References Cited

U.S. PATENT DOCUMENTS

| | | | |
|---|---|---|---|
| 3,665,423 A | 5/1972 | Nakamuma et al. | |
| 3,877,054 A | 4/1975 | Boulin et al. | |
| 3,964,085 A | 6/1976 | Kahng et al. | |
| 4,173,791 A | 11/1979 | Bell | |
| 4,217,601 A | 8/1980 | DeKeersmaecker et al. | |
| 4,413,022 A | 11/1983 | Suntola et al. | |
| 4,507,673 A | 3/1985 | Aoyama et al. | |
| 4,661,833 A | 4/1987 | Mizutani | |
| 4,939,559 A | 7/1990 | DiMaria et al. | |
| 5,016,215 A * | 5/1991 | Tigelaar ................. | 365/185.16 |
| 5,017,977 A | 5/1991 | Richardson | |

(Continued)

FOREIGN PATENT DOCUMENTS

JP  03-222367  10/1991

(Continued)

OTHER PUBLICATIONS

Abbas, S. A., et al., "N-Channel Igfet Design Limitations Due to Hot Electron Trapping", *Technical Digest, International Electron Devices Meeting.*, Washington, DC,(Dec. 1975),35-38.

(Continued)

*Primary Examiner*—Jung H. Hur
(74) *Attorney, Agent, or Firm*—Schwegman, Lundberg & Woessner, P.A.

(57) ABSTRACT

One floating gate transistor embodiment includes a first source/drain region, a second source/drain region, and a channel region therebetween. A floating gate is separated from the channel region by a first gate oxide. The floating gate includes oxide-conductor nanolaminate layers to trap charge in potential wells formed by different electron affinities of the oxide-conductor nanolaminate layers.

28 Claims, 12 Drawing Sheets

U.S. PATENT DOCUMENTS

| | | |
|---|---|---|
| 5,021,999 A | 6/1991 | Kohda et al. |
| 5,027,171 A | 6/1991 | Reedy et al. |
| 5,111,430 A | 5/1992 | Morie |
| 5,253,196 A | 10/1993 | Shimabukuro |
| 5,274,249 A | 12/1993 | Xi et al. |
| 5,293,560 A | 3/1994 | Harari |
| 5,298,447 A | 3/1994 | Hong |
| 5,303,182 A | 4/1994 | Nakao et al. |
| 5,317,535 A | 5/1994 | Talreja et al. |
| 5,388,069 A | 2/1995 | Kokubo |
| 5,409,859 A | 4/1995 | Glass et al. |
| 5,424,993 A | 6/1995 | Lee et al. |
| 5,430,670 A | 7/1995 | Rosenthal |
| 5,434,815 A | 7/1995 | Smarandoiu et al. |
| 5,438,544 A | 8/1995 | Makino |
| 5,449,941 A | 9/1995 | Yamazaki et al. |
| 5,467,306 A | 11/1995 | Kaya et al. |
| 5,477,485 A | 12/1995 | Bergemont et al. |
| 5,485,422 A | 1/1996 | Bauer et al. |
| 5,493,140 A | 2/1996 | Iguchi |
| 5,508,543 A | 4/1996 | Hartstein et al. |
| 5,508,544 A | 4/1996 | Shah |
| 5,530,581 A | 6/1996 | Cogan |
| 5,602,777 A | 2/1997 | Nawaki et al. |
| 5,627,781 A | 5/1997 | Hayashi et al. |
| 5,670,790 A | 9/1997 | Katoh et al. |
| 5,677,867 A | 10/1997 | Hazani |
| 5,698,022 A | 12/1997 | Glassman et al. |
| 5,714,766 A | 2/1998 | Chen et al. |
| 5,740,104 A | 4/1998 | Forbes |
| 5,754,477 A | 5/1998 | Forbes |
| 5,768,192 A | 6/1998 | Eitan |
| 5,795,808 A | 8/1998 | Park |
| 5,801,401 A | 9/1998 | Forbes |
| 5,828,605 A | 10/1998 | Peng et al. |
| 5,840,897 A | 11/1998 | Kirlin et al. |
| 5,852,306 A | 12/1998 | Forbes |
| 5,856,688 A | 1/1999 | Lee et al. |
| 5,886,368 A | 3/1999 | Forbes et al. |
| 5,891,773 A | 4/1999 | Saitoh |
| 5,912,488 A | 6/1999 | Kim et al. |
| 5,923,056 A | 7/1999 | Lee et al. |
| 5,936,274 A | 8/1999 | Forbes et al. |
| 5,943,262 A | 8/1999 | Choi |
| 5,959,896 A | 9/1999 | Forbes |
| 5,973,356 A | 10/1999 | Noble et al. |
| 5,989,958 A | 11/1999 | Forbes |
| 5,991,225 A | 11/1999 | Forbes et al. |
| 6,005,790 A | 12/1999 | Chan et al. |
| 6,011,725 A | 1/2000 | Eitan |
| 6,020,024 A | 2/2000 | Maiti et al. |
| 6,027,961 A | 2/2000 | Maiti et al. |
| 6,049,479 A | 4/2000 | Thurgate et al. |
| 6,072,209 A | 6/2000 | Noble et al. |
| 6,110,529 A | 8/2000 | Gardiner et al. |
| 6,115,281 A | 9/2000 | Aggarwal et al. |
| 6,122,201 A | 9/2000 | Lee et al. |
| 6,124,729 A | 9/2000 | Noble et al. |
| 6,143,636 A | 11/2000 | Forbes et al. |
| 6,153,468 A | 11/2000 | Forbes et al. |
| 6,160,739 A | 12/2000 | Wong |
| 6,166,401 A | 12/2000 | Forbes |
| 6,171,900 B1 | 1/2001 | Sun |
| 6,194,228 B1 | 2/2001 | Fujiki et al. |
| 6,203,613 B1 | 3/2001 | Gates et al. |
| 6,212,103 B1 | 4/2001 | Ahrens et al. |
| 6,222,768 B1 | 4/2001 | Hollmer et al. |
| 6,225,168 B1 | 5/2001 | Gardner et al. |
| 6,238,976 B1 | 5/2001 | Noble et al. |
| 6,243,300 B1 | 6/2001 | Sunkavalli |
| 6,246,606 B1 | 6/2001 | Forbes et al. |
| 6,255,683 B1 | 7/2001 | Radens et al. |
| 6,294,813 B1 | 9/2001 | Forbes et al. |
| 6,310,376 B1 | 10/2001 | Ueda et al. |
| 6,313,518 B1 | 11/2001 | Ahn et al. |
| 6,320,784 B1 | 11/2001 | Muralidhar et al. |
| 6,320,786 B1 | 11/2001 | Chang et al. |
| 6,351,411 B2 | 2/2002 | Forbes et al. |
| 6,353,554 B1 | 3/2002 | Banks |
| 6,365,470 B1 | 4/2002 | Maeda |
| 6,387,712 B1 | 5/2002 | Yano et al. |
| 6,429,063 B1 | 8/2002 | Eitan |
| 6,432,779 B1 | 8/2002 | Hobbs et al. |
| 6,445,023 B1 | 9/2002 | Vaartstra et al. |
| 6,445,030 B1 | 9/2002 | Wu et al. |
| 6,449,188 B1 | 9/2002 | Fastow |
| 6,456,531 B1 | 9/2002 | Wang et al. |
| 6,456,536 B1 | 9/2002 | Sobek et al. |
| 6,458,701 B1 | 10/2002 | Chae et al. |
| 6,459,618 B1 | 10/2002 | Wang |
| 6,465,306 B1 | 10/2002 | Ramsbey et al. |
| 6,487,121 B1 | 11/2002 | Thurgate et al. |
| 6,490,204 B2 | 12/2002 | Bloom et al. |
| 6,490,205 B1 | 12/2002 | Wang et al. |
| 6,504,755 B1 | 1/2003 | Katayama et al. |
| 6,521,950 B1 | 2/2003 | Shimabukuro et al. |
| 6,521,958 B1 | 2/2003 | Forbes et al. |
| 6,525,969 B1 | 2/2003 | Kurihara et al. |
| 6,541,280 B2 | 4/2003 | Kaushik et al. |
| 6,541,816 B2 | 4/2003 | Ramsbey et al. |
| 6,545,314 B2 | 4/2003 | Forbes et al. |
| 6,552,387 B1 | 4/2003 | Eitan |
| 6,559,014 B1 | 5/2003 | Jeon |
| 6,566,699 B2 | 5/2003 | Eitan |
| 6,567,303 B1 | 5/2003 | Hamilton et al. |
| 6,567,312 B1 | 5/2003 | Torii et al. |
| 6,570,787 B1 | 5/2003 | Wang et al. |
| 6,580,124 B1 | 6/2003 | Cleeves et al. |
| 6,586,785 B2 | 7/2003 | Flagan et al. |
| 6,596,617 B1 | 7/2003 | King et al. |
| 6,618,290 B1 | 9/2003 | Wang et al. |
| 6,630,381 B1 | 10/2003 | Hazani |
| 6,642,573 B1 | 11/2003 | Halliyal et al. |
| 6,674,138 B1 | 1/2004 | Halliyal et al. |
| 6,714,455 B2 | 3/2004 | Banks |
| 6,723,606 B2 | 4/2004 | Flagan et al. |
| 6,804,136 B2 | 10/2004 | Forbes |
| 6,867,097 B1 | 3/2005 | Ramsbey et al. |
| 6,873,539 B1 | 3/2005 | Fazan et al. |
| 6,888,739 B2 | 5/2005 | Forbes |
| 6,970,370 B2 | 11/2005 | Forbes |
| 6,996,009 B2 | 2/2006 | Forbes |
| 7,045,430 B2 | 5/2006 | Ahn et al. |
| 7,221,017 B2 * | 5/2007 | Forbes et al. ............... 257/316 |
| 7,221,586 B2 * | 5/2007 | Forbes et al. ........... 365/185.05 |
| 7,348,237 B2 | 3/2008 | Forbes |
| 7,369,435 B2 | 5/2008 | Forbes |
| 7,433,237 B2 | 10/2008 | Forbes et al. |
| 7,476,586 B2 | 1/2009 | Forbes |
| 7,489,545 B2 | 2/2009 | Forbes et al. |
| 7,494,873 B2 | 2/2009 | Forbes et al. |
| 2002/0003252 A1 | 1/2002 | Iyer |
| 2002/0027264 A1 | 3/2002 | Forbes et al. |
| 2002/0074565 A1 | 6/2002 | Flagan et al. |
| 2002/0089023 A1 | 7/2002 | Yu et al. |
| 2002/0115252 A1 | 8/2002 | Haukka et al. |
| 2003/0032270 A1 | 2/2003 | Snyder et al. |
| 2003/0234420 A1 | 12/2003 | Forbes |
| 2003/0235066 A1 | 12/2003 | Forbes |
| 2003/0235077 A1 | 12/2003 | Forbes |
| 2003/0235079 A1 | 12/2003 | Forbes |
| 2003/0235081 A1 | 12/2003 | Forbes |
| 2003/0235085 A1 | 12/2003 | Forbes |
| 2004/0063276 A1 | 4/2004 | Yamamoto et al. |

| | | | |
|---|---|---|---|
| 2006/0001080 | A1 | 1/2006 | Forbes |
| 2006/0002188 | A1 | 1/2006 | Forbes |
| 2006/0284246 | A1 | 12/2006 | Forbes et al. |
| 2007/0178643 | A1 | 8/2007 | Forbes et al. |
| 2009/0002025 | A1 | 1/2009 | Forbes et al. |

FOREIGN PATENT DOCUMENTS

| | | |
|---|---|---|
| JP | 06-224431 | 8/1994 |
| JP | 06-302828 | 10/1994 |
| JP | 08-255878 | 10/1996 |
| WO | WO-9907000 A2 | 2/1999 |
| WO | WO-9917371 A1 | 4/1999 |

OTHER PUBLICATIONS

Ahn, Seong-Deok, et al., "Surface Morphology Improvement of Metalorganic Chemical Vapor Deposition Al Films by Layered Deposition of Al and Ultrathin TIN", *Japanese Journal of Applied Physics, Part 1 (Regular Papers, Short Notes & Review Papers)*, 39(6A), (Jun. 2000), 3349-3354.

Alen, Petra, et al., "Atomic Layer Deposition of Ta(Al)N(C) Thin Films Using Trimethylaluminum as a Reducing Agent", *Journal of the Electrochemical Society*, 148(10), (Oct. 2001),G566-G571.

Asari, K, et al., "Multi-mode and multi-level technologies for FeRAM embedded reconfigurable hardware", *Solid-State Circuits Conference, 1999, Digest of Technical Papers, ISSCC. 1999 IEEE International*, (Feb. 15-17, 1999),106-107.

Britton, J, et al., "Metal-nitride-oxide IC memory retains data for meter reader", *Electronics*, 45(22), (Oct. 23, 1972),119-23.

Carter, R.J., "Electrical Characterization of High-k Materials Prepared By Atomic Layer CVD", *IWGI*, (2001),94-99.

Chae, Junghun, et al., "Atomic Layer Deposition of Nickel by the Reduction of Preformed Nickel Oxide", *Electrochemical & Solid-State Letters*, 5(6), (Jun. 2002),C64-C66.

Chaitsak, Sutical, et al., "Cu(InGa)Se/sub 2/ thin-film solar cells with high resistivity ZnO buffer layers deposited by atomic layer deposition", *Japanese Journal of Applied Physics Part 1-Regular Papers Short Notes & Review Papers*, 38(9A), (Sep. 1999),4989-4992.

Chang, C., "Novel Passivation Dielectrics-The Boron- or Phosphorus-Doped Hydrogenated Amorphous Silicon Carbide Films", *Journal of the Electrochemical Society*, 132, (Feb. 1985),418-422.

Cricchi, J R., et al., "Hardened MNOS/SOS electrically reprogrammable nonvolatile memory", *IEEE Transactions on Nuclear Science*, 24(6), (Dec. 1977),2185-9.

Demichelis, F., "Influence of Doping on the Structural and Optoelectronic Properties of Amorphous and Microcrystalline Silicon Carbide", *Journal of Applied Physics*, 72(4), (Aug. 15, 1992), 1327-1333.

Demichelis, F., "Physical Properties of Undoped and Doped Microcrystalline SiC:H Deposited By PECVD", *Materials Research Society Symposium Proceedings*, 219, Anaheim, CA,(Apr. 30-May 3, 1991),413-418.

Dimaria, D., "Graded or stepped energy band-gap-insulator MIS structures (GI-MIS or SI-MIS)", *J. Appl. Phys.*, 50(9),(Sep. 1979),5826-5829.

Dimaria, D J., "Graded or stepped energy band-gap-insulator MIS structures (GI-MIS or SI-MIS)", *Journal of Applied Physics*, 50(9), (Sep. 1979),5826-5829.

Dipert, B., et al., "Flash Memory goes Mainstream", *IEE Spectrum*, No. 10, (Oct. 1993),48-50.

Eitan, Boaz, et al., "NROM: A Novel Localized Trapping, 2-Bit Nonvolatile Memory Cell", *IEEE Electron Device Letters*, 21(11), (Nov. 2000),543-545.

Elam, J W., et al., "Kinetics of the WF6 and $Si_2H_6$ surface reactions during tungsten atomic layer deposition", *Surface Science*, 479(1-3), (May 2001),121-135.

Fauchet, P M., et al., "Optoelectronics and photovoltaic applications of microcrystalline SiC", *Symp. on Materials Issues in Mecrocrystalline Semiconductors*, (1989),291-292.

Ferris-Prabhu, A V., "Amnesia in layered insulator FET memory devices", *1973 International Electron Devices Meeting Technical Digest*, (1973),75-77.

Ferris-Prabhu, A V., "Charge transfer in layered insulators", *Solid-State Electronics*, 16(9), (Sep. 1973),1086-7.

Ferris-Prabhu, A V., "Tunnelling theories of non-volatile semiconductor memories", *Physica Status Solldi A*, 35(1), (May 16, 1976),243-50.

Fisch, D E., et al., "Analysis of thin film ferroelectric aging", *Proc. IEEE Int. Reliability Physics Symp.*, (1990),237-242.

Forbes, L., et al., "Field Induced Re-Emission of Electrons Trapped in SiO", *IEEE Transactions on Electron Devices*, ED-26 (11), Briefs,(Nov. 1979),1816-1818.

Forsgren, Katarina, "Atomic Layer Deposition of $HfO_2$ using hafnium iodide", *Conference held in Monterey, California*, (May 2001),1 page.

Frohman-Bentchkowsky, D, "An Integrated metal-nitride-oxide-silicon (MNOS) memory", *Proceedings of the IEEE*, 57(6), (Jun. 1969),1190-1192.

Goodwins, Rupert, "New Memory Technologies on the Way", http://zdnet.com.com/2100-1103-846950.html, (Feb. 2002).

Guha, S, et al., "Atomic beam deposition of lanthanum-and yttrium-based oxide thin films for gate dielectrics", *Applied Physics Letters*, 77, (2000),2710-2712.

Hwang, C G., "Semiconductor Memories for the IT Era", *2002 IEEE International Solid-State Circuits Conference. Digest of Technical Papers IEEE*. Part vol. 1, San Francisco,(2002),24-27.

Hwang, N., et al., "Tunneling and Thermal Emission of Electrons from a Distribution of Deep Traps in SiO", *IEEE Transactions on Electron Devices*, 40(6), (Jun. 1993),1100-1103.

Juppo, Marika, "Use of 1,1-Dimethylhydrazine in the Atomic Layer Deposition of Transition Metal Nitride Thin Films", *Journal of the Electrochemical Society*, 147(9). (Sep. 2000),3377-3381.

Klaus, J W., et al., "Atomic layer deposition of tungsten nitride films using sequential surface reactions", *Journal of the Electrochemical Society*, 147(3), (Mar. 2000),1175-81.

Kukli, Kaupo, "Tailoring the dielectric properties of $HfO_2$-$Ta_2O_3$ nanolaminates", *Appl. Phys. Lett.*, 68, (1996),3737-3739.

Leskela, M, "ALD precursor chemistry; Evolution and future challenges", *Journal de Physique IV (Proceedings)*, 9(8), (Sep. 1999),837-852.

Liu, Z., et al., "Low Programming Voltages and Long Retention Time in Metal Nanocrystal EEPROM Devices", *Digest of the IEEE Device Research Conference*, Notre Dame, Indiana,(Jun. 25-27, 2001),79-80.

Luan, H., "High Quality $Ta_2O_6$ Gate Dielectrics with Tox,eq less than 10A", *IEDM*, (1999),pp. 141-144.

Lusky, Eli, et al., "Characterization of Channel Hot Electron Injection by the Subthreshold Slope of NROM Device", *IEEE Electron Device Letters*, 22(11), (Nov. 2001),556-558.

Lusky, et al., "Characterization of channel hot electron injection by the subthreshold slope of NROM/sup TM/ device", *IEEE Electron Device Letters*, vol. 22, No. 11, (Nov. 2001),556-558.

Maayan, E., et al., "A 512Mb BROM Flash Data Storage: Memory with 8MB/s Data Rate", *ISSCC 2002 / Session 6 / SRAM and Non-Volatile Memories*, (Feb. 2002),4 pages.

Martins, R, "Transport Properties of Doped Silicon Oxycarbide Microcrystalline Films Produced by Spatial Separation Techniques", *Solar Energy Materials and Solar Cells*, 41-42, (1996),493-517.

Martins, R., "Wide Band Gap Microcrystalline Silicon Thin Films", *Diffusion and Defeat Data : Solid State Phenomena*, 44-46, Part 1, Scitec Publications,(1995),299-346.

Min, Jae-Sik, et al., "Atomic layer deposition of TiN films by alternate supply of tetrakis (ethylmenthylamino)-titanium and ammonia", *Japanese Journal of Applied Physics Part 1-Regular Papers Short Notes & Review Papers*, 37(9A), (Sep. 1998),4999-5004.

Min, J., "Metal-organic atomic-layer deposition of titanium-silicon-nitride films", *Applied Physics Letters*, 75(11), (1999),1521-1523.

Moazzami, R, "Endurance properties of Ferroelectric PZT thin films", *Int. Electron Devices Mtg.*, San Francisco,(1990),417-20.

Moazzami, R, "Ferroelectric PZT thin films for semiconductor memory", *Ph.D Thesis, University of California*, Berkeley, (1991).

Morishita, S, "Atomic-layer chemical-vapor-deposition of $SiO_2$ by cyclic exposures of $CH_3/OSi(NCO)_3$ and $H_2/O_2$", *Japanese Journal of Applied Physics Part 1-Regular Papers Short Notes & Review Papers*, 34(10), (Oct. 1995),5738-42.

Moriwaki, Masaru, et al., "Improved metal gate process by simultaneous gate-oxide nitridation during W/WN/sub x/gate formation", *Japanese Journal of Applied Physics Part 1-Regular Papers Short Notes & Review Papers*, 39(4B), (Apr. 2000),2177-2180.

Muller, R. S., et al., *In: Device Electronics for Integrated Circuits, Second Edition*, John Wiley & Sons, New York,(1986),p. 157.

Niilisk, A, "Atomic-scale optical monitoring of the initial growth of $TiO_2$ thin films", *Proceedings of the SPIE—The International Society for Optical Engineering*, 4318,(2001),72-77.

Park, Jin-Seong, et al., "Plasma-Enhanced Atomic Layer Deposition of Tantalum Nitrides Using Hydrogen Radicals as a Reducing Agent", *Electrochemical & Solid-State Letters*, 4(4), (Apr. 2001),C17-19.

Renlund, G. M., "Silicon oxycarbide glasses: Part I. Preparation and chemistry", *J. Mater, Res.*, (Dec. 1991),pp. 2716-2722.

Renlund, G. M., "Silicon oxycarbide glasses: Part II. Structure and properties", *J. Mater, Res.*, vol. 6, No. 12,(Dec. 1991),pp. 2723-2734.

Ritala, Mikko, "Atomic Layer Epitaxy Growth of Titanium, Zirconium and Hafnium Dioxide Thin Films", *Annales Academiae Scientlarum Fennicae*, (1994),24-25.

Robertson, J., "Band offsets of wide-band-gap oxides and implications for future electronic devices", *Journal of Vacuum Science & Technology B (Microelectronics and Nanometer Structures)*, 18(3), (May-Jun. 2000),1785-1791.

Sanders, B W., et al., "Zinc Oxysulfide Thin Films Grown by Atomic Layer Depostion", *Chemistry of Materials*, 4(5), (1992),1005-1011.

She, Min, et al., "Modeling and design study of nanocrystal memory devices", *IEEE Device Research Conference*, (2001),139-40.

Shimada, Hiroyuki, et al., "Tantalum nitride metal gate FD-SOI CMOS FETs using low resistivity self-grown bcc-tantalum layer", *IEEE Transactions on Electron Devices*, vol. 48, No. 8, (Aug. 2001), 1619-1626.

Shirota, R, et al., "A 2.3 mu m/sup 2/ memory cell structure for 16 Mb NAND EEPROMs", *International Electron Devices Meeting 1990. Technical Digest*, San Francisco,(1990),103-106.

Sneh, Ofer, "Thin film atomic layer deposition equipment for semiconductor processing", *Thin Solid Films*, 402(1-2), (2002),248-261.

Solanki, Raj, et al., "Atomic Layer Deposition of Copper Seed Layers", *Electrochemical & Solid-State Letters*, 3(10), (Oct. 2000),479-480.

Song, Hyun-Jung, et al., "Atomic Layer Deposition of $Ta_2O_5$ Films Using TA(OC2H5)5 and NH3", *Ultrathin SiO/sub 2/ and High-K Materials for ULSI Gate Dielectrics. Symposium*, (1999),469-471.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992);84-89.

Sze, S M., "Physics of Semiconductor Devices", *New York : Wiley*, (1981),504-506.

Wei, L S., et al., "Trapping, emission and generation in MNOS memory devices", *Solid-State Electronics*, 17(6), (Jun. 1974),591-8.

White, M H., et al., "Characterization of thin-oxide MNOS memory transistors", *IEEE Transactions on Electron Devices*, ED-19(12), (Dec. 1972),1280-1288.

White, M H., "Direct tunnellng in metal-nitride-oxide-silicon (MNOS) structures", *Programme of the 31st physical electronics conference*, (1971),1.

Wood, S W., "Ferroelectric memory design", *M.A.Sc. thesis, University of Toronto*, (1992).

Yagishita, Atsushi, et al., "Dynamic threshold voltage damascene metal gate MOSFET (DT-DMG-MOS) with low threshold voltage, high drive current and uniform electrical characteristics", *International Electron Devices Meeting 2000. Technical Digest. IEDM*, (Dec. 2000),663-666.

Yoder, M, "Wide Bandgap Semiconductor Materials and Devices", *IEEE Transactions on Electron Devices*, 43, (Oct. 1996),1633-1636.

Zhu, W J., et al., "Current transport in metal/hafnium oxide/silicon structure", *IEEE Electron Device Letters*, 23, (2002),97-99.

Dipert, Brian, "Flash Memory Goes Mainstream", *IEEE Spectrum*, 30(10), (Oct. 1993),48-52.

Lusky, Eli , et al., "Characterization of channel hot electron injection by the subthreshold slope of NROM/sup TM/ device", *IEEE Electron Device Letters*, 22(11), (Nov. 2001),556-558.

Maayan, Eduardo , et al., "A 512Mb NROM Flash Data Storage Memory with 8MB/s Data Rate", *Solid-State Circuits Conference, 2002. Digest of Technical Papers. ISSCC*, (2002),4 pgs.

Sneh, Ofer , "Thin film atomic layer deposition equipment for semiconductor processing", *Thin Solid Films*, 402, (2002),248-261.

Sze, S M., "Physics of semiconductor devices", *New York: Wiley*, (1981),504-506.

Wilk, G. D., "High-K gate dielectrics: Current status and materials properties considerations", *Journal of Applied Physics*, 89(10), (2001),5243-5275.

US 7,262,094, 08/2007, Forbes (withdrawn)

* cited by examiner

MEMORY UTILIZING OXIDE-CONDUCTOR NANOLAMINATES

CROSS REFERENCE TO RELATED APPLICATIONS

The present application is a divisional of U.S. application Ser. No. 10/191,336, filed Jul. 8, 2002, now issued as U.S. Pat. No. 7,221,017, which is incorporated herein by reference in its entirety.

This application is related to the following, commonly assigned U.S. patent applications: "Memory Utilizing Oxide Nanolaminates," Ser. No. 10/190,717, filed Jul. 8, 2002, now issued as U.S. Pat. No. 7,221,586; and "Memory Utilizing Oxide-Nitride Nanolaminates," Ser. No. 10/190,689, filed Jul. 8, 2002; each of which disclosure is herein incorporated by reference.

FIELD OF THE INVENTION

The present invention relates generally to semiconductor integrated circuits and, more particularly, to memory utilizing oxide-conductor nanolaminates.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g. a metal oxide semiconducting field effect transistor (MOSFET), coupled to a capacitor cell.

Another type of high speed, low cost memory includes floating gate memory cells. A conventional horizontal floating gate transistor structure includes a source region and a drain region separated by a channel region in a horizontal substrate. A floating gate is separated by a thin tunnel gate oxide. The structure is programmed by storing a charge on the floating gate. A control gate is separated from the floating gate by an intergate dielectric. A charge stored on the floating gate effects the conductivity of the cell when a read voltage potential is applied to the control gate. The state of cell can thus be determined by sensing a change in the device conductivity between the programmed and un-programmed states.

With successive generations of DRAM chips, an emphasis continues to be placed on increasing array density and maximizing chip real estate while minimizing the cost of manufacture. It is further desirable to increase array density with little or no modification of the DRAM optimized process flow.

Multilayer insulators have been previously employed in memory devices. The devices in the above references employed oxide-tungsten oxide-oxide layers. Other previously described structures described have employed charge-trapping layers implanted into graded layer insulator structures.

More recently oxide-nitride-oxide structures have been described for high density nonvolatile memories. All of these are variations on the original MNOS memory structure described by Fairchild Semiconductor in 1969 which was conceptually generalized to include trapping insulators in general for constructing memory arrays.

Studies of charge trapping in MNOS structures have also been conducted by White and others.

Some commercial and military applications utilized non-volatile MNOS memories.

However, these structures did not gain widespread acceptance and use due to their variability in characteristics and unpredictable charge trapping phenomena. They all depended upon the trapping of charge at interface states between the oxide and other insulator layers or poorly characterized charge trapping centers in the insulator layers themselves. Since the layers were deposited by CVD, they are thick, have poorly controlled thickness and large surface state charge-trapping center densities between the layers.

Flash memories based on electron trapping are well known and commonly used electronic components. Recently NAND flash memory cells have become common in applications requiring high storage density while NOR flash memory cells are used in applications requiring high access and read speeds. NAND flash memories have a higher density because 16 or more devices are placed in series, this increases density at the expense of speed.

Thus, there is an ongoing need for improved DRAM technology compatible floating gate transistor cells. It is desirable that such floating gate transistor cells be fabricated on a DRAM chip with little or no modification of the DRAM process flow. It is further desirable that such floating gate transistor cells provide increased density and high access and read speeds.

REFERENCES

Boulin et al., "Semiconductor Memory Apparatus with a Multi-Layer Insulator Contacting the Semiconductor," U.S. Pat. No. 3,877,054;

Kahng et al., "Method for Fabricating Multilayer Insulator-Semiconductor Memory Apparatus," U.S. Pat. No. 3,964,085;

DiMaria, D. J., "Graded or Stepped Energy Band-Gap-Insulator MIS structures (GI-MIS or SI-MIS)," Journal of Applied Physics, 50(9), 5826-9 (September 1979);

DeKeersmaecker et al., "Non-Volatile Memory Devices Fabricated From Graded or Stepped Energy Band Gap Insulator MIM or MIS Structure," U.S. Pat. No. 4,217,601, RE31,083;

Eitan, "Non-volatile semiconductor memory cell utilizing asymmetrical charge trapping," U.S. Pat. No. 5,768,192;

Etian, B. et al., "NROM: A Novel Localized Trapping, 2-Bit Nonvolatile Memory Cell," IEEE Electron Device Lett., 21(11), 543-545 (November 2000);

Eitan, B. et al., "Characterization of Channel Hot Electron Injection by the Subthreshold Slope of NROM device," IEEE Electron Device Lett., 22(11), 556-558 (November 2001);

Frohman-Bentchkowsky, D., "An Integrated Metal-Nitride-Oxide-Silicon (MNOS) Memory," Proceedings of the IEEE, 57(6), 1190-2 (June 1969);

Nakamuma et al., "Memory matrix using MIS semiconductor element," U.S. Pat. No. 3,665,423;

Britton, J. et al., "Metal-Nitride-Oxide IC Memory Retains Data for Meter Reader," Electronics, 45(22); 119-23(23 Oct. 1972);

B. Dipert and L. Hebert, "Flash Memory goes Mainstream," IEEE Spectrum, No. 10, pp. 48-52, (October 1993);

R. Goodwins, "New Memory Technologies on the Way," http://zdnet.com.com/2100-1103-846950.html);

C.-G. Hwang, "Semiconductor Memories for the IT Era," Abst. IEEE Int. Solid-State Circuits Conf., San Francisco, 2002, pp. 24-27;

R. Shirota et al., "A 2.3 mu$^2$ memory cell structure for 16 Mb NAND EEPROMs," Digest of IEEE Int. Electron Device Meeting, San Francisco, 1990, pp. 103-106;

L. Forbes, W. P. Noble and E. H. Cloud, "MOSFET Technology for Programmable Address Decode and Correction," U.S. Pat. No. 6,521,950;

S. Sze, Physics of Semiconductor Devices, Wiley, N.Y., 1981, pp. 504-506);

L. Forbes and J. Geusic, "Memory Using Insulator Traps," U.S. Pat. No. 6,140,181;

A. Yagishita et al., "Dynamic threshold voltage damascene metal gate MOSFET (DT-DMG-MOS) with low threshold voltage, high drive current and uniform electrical characteristics," Digest Technical Papers Int. Electron Devices Meeting, San Francisco, pp. 663-666 (December 2000);

H. Shimada et al., "Tantalum Nitride Metal Gate FD-SOI CMOS FETs Using Low Resistivity Self-Grown BCC-Tantalum Layer," IEEE Trans. Electron Devices, Vol. 48, No. 8, pp. 1619-1626 (2000);

M. Moriwaki et al. "Improved Metal Gate Process by Simultaneous Gate-Oxide Nitridation During W/WN/Sub X/Gate Formation," Jpn. J. Appl. Phys., Vol. 39, No. 4B, pp. 2177-2180 (2000);

A. Yagishita et al., "Dynamic Threshold Voltage Damascene Metal Gate MOSFET (DT-DMG-MOS) With Low Threshold Voltage, High Drive Current and Uniform Electrical Characteristics," Digest Technical Papers Int. Electron Devices Meeting, San Francisco, Dec. 2000, pp. 663-666;

Jin-Seong Park et al, "Plasma-Enhanced Atomic Layer Deposition of Tantalum Nitrides Using Hydrogen Radicals as a Reducing Agent," Electrochemical and Solid-State Lett.);

J.-S. Min et al., "Atomic Layer Deposition of TiN Films by Alternate Supply on Tetrakis (Ethylmethyllamino)-Titanium and Ammonia," Jpn. J. Appl. Phys., Vol. 37, Part 1, No. 9A, pp. 4999-5004 (15 Sep. 1998);

Raj Solanki et al., "Atomic Layer Deposition of Copper Seed Layers," Electrochemical and Solid-State Letters, 3 (10) 479-480 (2000);

Marika Juppo et al., "Use of 1,1-Dimethylhydrazine in the Atomic Layer Deposition of Transition Metal Nitride Thin Films," Jour. of the Electrochemical Soc., 147 (9) 3377-3381 (2000);

Kraus, J. W. et al., "Atomic Layer Deposition of Tungsten Nitride Films Using Sequential Surface Reactions," Jour. of the Electrochemical Soc., Vol. 147, No. 3, 1173-1181 (2000);

Suticai Chaitsak et al, "Cu(InGa)$Se_2$ Thin-Film Solar Cells with High Resistivity ZnO Buffer Layers Deposited by Atomic Layer Deposition," Jpn. J. Appl. Phys., Vol. 38, pp. 4989-4992 (1999);

B. W. Sanders et al, "Zinc Oxysulfide Thin Films Grown by Atomic Layer Deposition," Chem. Mater. 1992, 4, 1005-1011;

Elam, J. W. et al., "Kinetics of the $WF_6$ and $Si_2H_6$ Surface Reactions During Tungsten Atomic Layer Deposition," Surface Science, Vol. 479, No. 1-3, pp. 121-135 (2001);

Junghun Chea et al., "Atomic Layer Deposition of Nickel by the Reduction of Preformed Nickel Oxide," Electrochemical and Solid-State Letters, 5, (6) C4-C66 (2002);

Forbes et al., "High Density Flash Memory," U.S. Pat. Nos. 5,936,274, 6,143,636;

Noble et al., "Ultra High Density Flash Memory," U.S. Pat. No. 5,973,356;

Noble et al., "Method of Forming High Density Flash Memory," U.S. Pat. No. 6,238,976;

Forbes et al., "Programmable Memory Address Decode Array with Vertical Transistors," U.S. Pat. No. 5,991,225;

Forbes et al., "Method of Forming a Logic Array for a Decoder," U.S. Pat. No. 6,153,468;

Nobel et al., "Field Programmable Logic Arrays with Vertical Transistors," U.S. Pat. No. 6,124,729.

SUMMARY OF THE INVENTION

The above mentioned problems for creating DRAM technology compatible floating gate transistor cells as well as other problems are addressed by the present invention and will be understood by reading and studying the following specification. This disclosure describes a flash memory device, programmable logic array device or memory address and decode correction device with an oxide-conductor nanolaminate floating gate rather than a conventional polysilicon floating gate.

In particular, an embodiment of the present invention includes a floating gate transistor utilizing oxide-conductor nanolaminates. The floating gate transistor includes a first source/drain region, a second source/drain region, and a channel region therebetween. A floating gate is separated from the channel region by a first gate oxide. The floating gate includes oxide-conductor nanolaminate layers to trap charge in potential wells formed by different electron affinities of the oxide-conductor nanolaminate layers.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
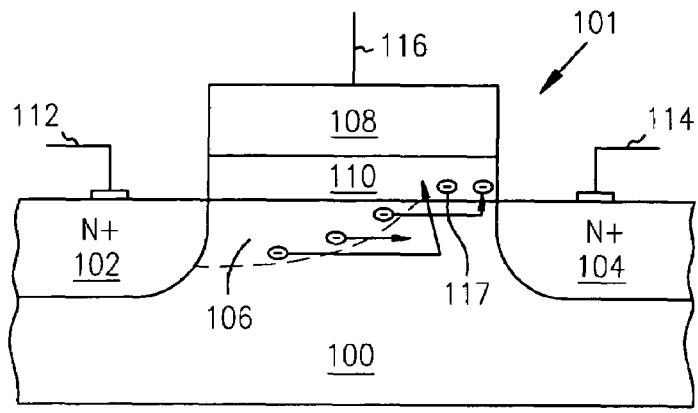
FIG. 1A is a block diagram of a metal oxide semiconductor field effect floating gate transistor (MOSFET) in a substrate according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is useful in illustrating the conventional operation of a MOSFET such as can be used in a DRAM array. FIG. 1A illustrates the normal hot electron injection and degradation of devices operated in the forward direction. As is explained below, since the electrons are trapped near the drain they are not very effective in changing the device characteristics.

FIG. 1A is a block diagram of a metal oxide semiconductor field effect floating gate transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
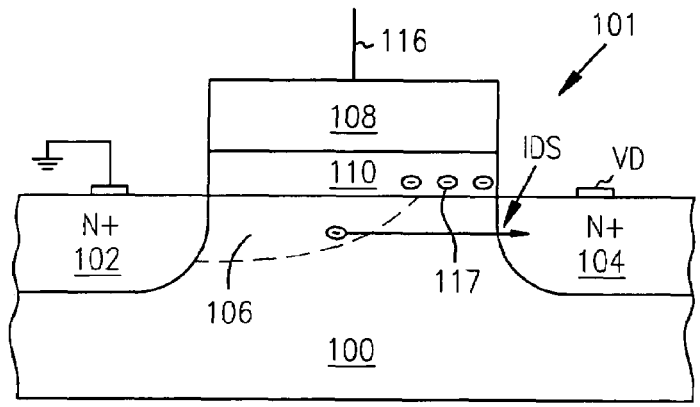
FIG. 1B illustrates the MOSFET of FIG. 1A operated in the forward direction showing some degree of device degradation due to electrons being trapped in the gate oxide near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
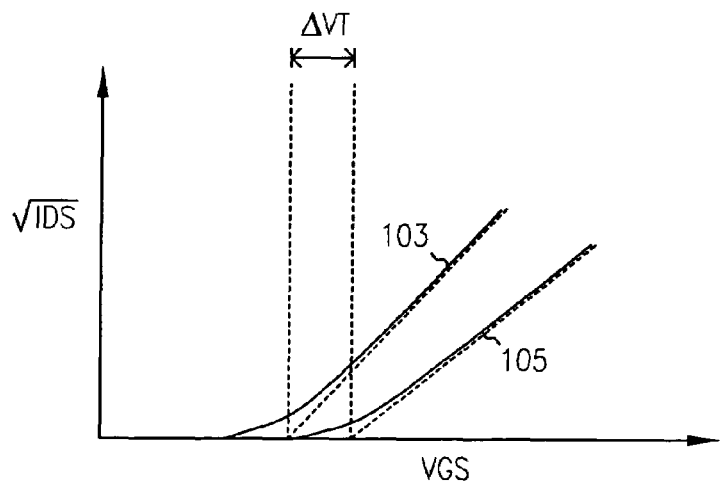
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The change in the slope of the plot of SQRT Ids versus VGS represents the change in the charge carrier mobility in the channel 106.

In FIG. 1C, $\Delta VT$ represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 103 represents the charge carrier mobility in the channel 106 for FIG. 1A having no electrons trapped in the gate oxide 110. Slope 105 represents the charge mobility in the channel 106 for the conventional MOSFET of FIG. 1B having electrons 117 trapped in the gate oxide 110 near the drain region 104. As shown by a comparison of slope 103 and slope 105 in FIG. 1C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

One of the inventors, along with others, has previously described programmable memory devices and functions based on the reverse stressing of MOSFET's in a conventional CMOS process and technology in order to form programmable address decode and correction in U.S. Pat. No. 6,521,950 entitled "MOSFET Technology for Programmable Address Decode and Correction." That disclosure, however, did not describe write once read only memory solutions, but rather address decode and correction issues. One of the inventors also describes write once read only memory cells employing charge trapping in gate insulators for conventional MOSFETs and write once read only memory employing floating gates. The same are described in co-pending, commonly assigned U.S. patent applications, entitled "Write Once Read Only Memory Employing Charge Trapping in Insulators," Ser. No. 10/177,077; and "Write Once Read Only Memory Employing Floating Gates," Ser. No. 10/177,083.

The present application, however, describes floating gate transistor cells having oxide-conductor nanolaminate layers and their use in integrated circuit device structures.

According to the teachings of the present invention, normal flash memory cells can be programmed by operation in the reverse direction and utilizing avalanche hot electron injection to trap electrons on the floating gate of the floating gate transistor. When the programmed floating gate transistor is subsequently operated in the forward direction the electrons trapped on the floating gate cause the channel to have a different threshold voltage. The novel programmed floating gate transistors of the present invention conduct significantly less current than conventional flash cells which have not been programmed. These electrons will remain trapped on the floating gate unless negative control gate voltages are applied. The electrons will not be removed from the floating gate when positive or zero control gate voltages are applied. Erasure can be accomplished by applying negative control gate voltages and/or increasing the temperature with negative control gate bias applied to cause the trapped electrons on the floating gate to be re-emitted back into the silicon channel of the MOSFET.

Figure 2A:
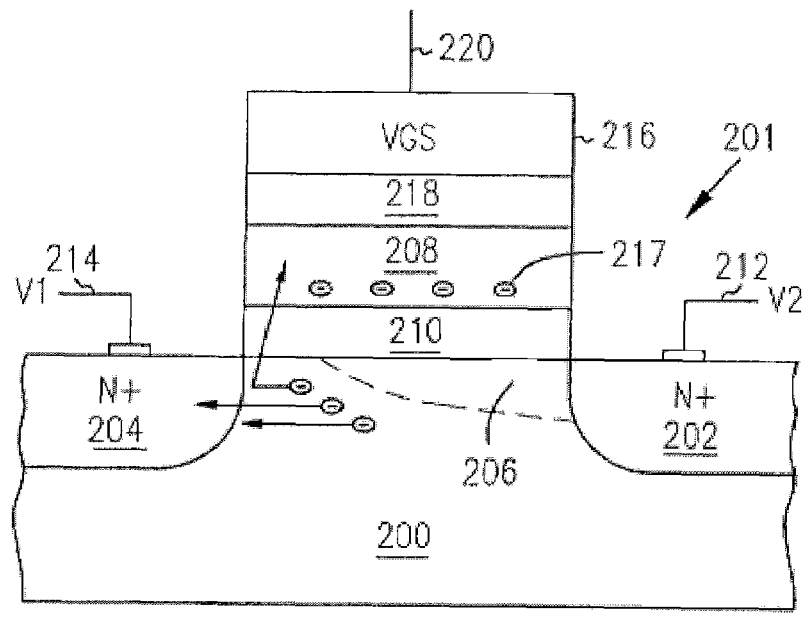
FIG. 2A is a diagram of an embodiment for a programmed floating gate transistor, having oxide-conductor nanolaminate layers, which can be used as a floating gate transistor cell according to the teachings of the present invention.

FIG. 2A is a diagram of an embodiment for a programmed floating gate transistor cell 201 having oxide-conductor nanolaminate layers according to the teachings of the present invention. As shown in FIG. 2A the floating gate transistor cell 201 includes a floating gate transistor in a substrate 200 which has a first source/drain region 202, a second source/drain region 204, and a channel region 206 between the first and second source/drain regions, 202 and 204. In one embodiment, the first source/drain region 202 includes a source region 202 for the floating gate transistor cell 201 and the second source/drain region 204 includes a drain region 204 for the floating gate transistor cell 201. FIG. 2A further illustrates the floating gate transistor cell 201 having oxide-conductor nanolaminate layers 208 serving as a floating gate 208 and separated from the channel region 206 by a first gate oxide 210. An sourceline or array plate 212 is coupled to the first source/drain region 202 and a transmission line 214 is coupled to the second source/drain region 204. In one embodiment, the transmission line 214 includes a bit line 214. Further as shown in FIG. 2A, a control gate 216 is separated from the oxide-conductor nanolaminate layers 208, or floating gate 208, by a second gate oxide 218.

As stated above, floating gate transistor cell 201 illustrates an embodiment of a programmed floating gate transistor. This programmed floating gate transistor has a charge 217 trapped in potential wells in the oxide-conductor nanolaminate layers 208, or floating gate 208, formed by the different electron affinities between materials in the structures 208, 210 and 218. In one embodiment, the charge 217 trapped on the floating gate 208 includes a trapped electron charge 217.

Figure 2B:
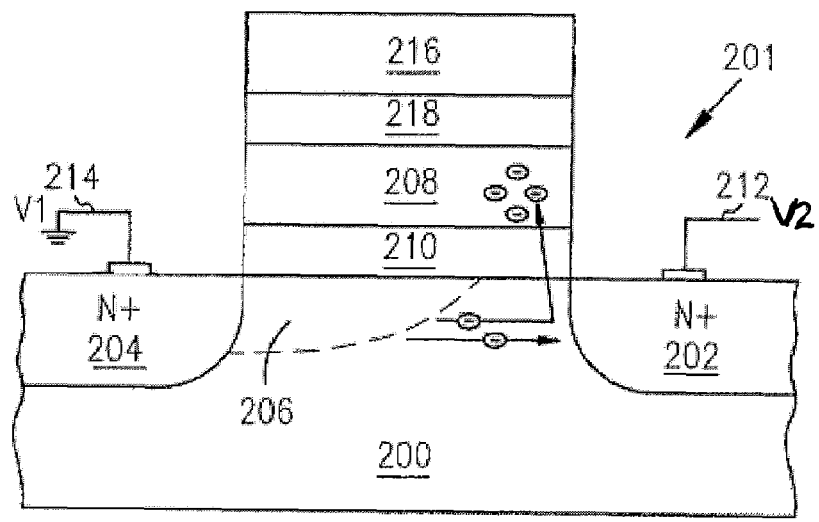
FIG. 2B is a diagram suitable for explaining a method embodiment by which a floating gate transistor, having oxide-conductor nanolaminate layers, can be programmed to achieve the embodiments of the present invention.

FIG. 2B is a diagram suitable for explaining the method by which the oxide-conductor nanolaminate layers 208, or floating gate 208, of the floating gate transistor cell 201 of the present invention can be programmed to achieve the embodiments of the present invention. As shown in FIG. 2B the method includes programming the floating gate transistor. Programming the floating gate transistor includes applying a first voltage potential V1 to a drain region 204 of the floating gate transistor and a second voltage potential V2 to the source region 202.

In one embodiment, applying a first voltage potential V1 to the drain region 204 of the floating gate transistor includes grounding the drain region 204 of the floating gate transistor as shown in FIG. 2B. In this embodiment, applying a second voltage potential V2 to the source region 202 includes biasing the array plate 212 to a voltage higher than VDD, as shown in FIG. 2B. A gate potential VGS is applied to the control gate 216 of the floating gate transistor. In one embodiment, the gate potential VGS includes a voltage potential which is less than the second voltage potential V2, but which is sufficient to establish conduction in the channel 206 of the floating gate transistor between the drain region 204 and the source region 202. As shown in FIG. 2B, applying the first, second and gate potentials (V1, V2, and VGS respectively) to the floating gate transistor creates a hot electron injection into the oxide-conductor nanolaminate layers 208, or floating gate 208, of the floating gate transistor. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the oxide-conductor nanolaminate layers 208. Here the charge carriers become trapped in potential wells in the oxide-conductor nanolaminate layers 208 formed by the different electron affinities between materials in the structures 208, 210 and 218.

In an alternative embodiment, applying a first voltage potential V1 to the drain region 204 of the floating gate transistor includes biasing the drain region 204 of the floating gate transistor to a voltage higher than VDD. In this embodiment, applying a second voltage potential V2 to the source region 202 includes grounding the sourceline or array plate 212. A gate potential VGS is applied to the control gate 216 of the floating gate transistor. In one embodiment, the gate potential VGS includes a voltage potential which is less than the first voltage potential V1, but which is sufficient to establish conduction in the channel 206 of the floating gate transistor between the drain region 204 and the source region 202. Applying the first, second and gate potentials (V1, V2, and VGS respectively) to the floating gate transistor creates a hot electron injection into the oxide-conductor nanolaminate layers 208 of the floating gate transistor. In other words, applying the first, second and gate potentials (V1, V2, and VGS respectively) provides enough energy to the charge carriers, e.g. electrons, being conducted across the channel 206 that, once the charge carriers are near the drain region 204, a number of the charge carriers get excited into the oxide-conductor nanolaminate layers 208, or floating gate 208. Here the charge carriers become trapped in potential wells in the oxide-conductor nanolaminate layers 208 formed by the different electron affinities between materials in the structures 208, 210 and 218, as shown in FIG. 2A.

In one embodiment of the present invention, the method is continued by subsequently operating the floating gate transistor in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the oxide-conductor nanolaminate layers 208, or floating gate 208. That is, a gate potential can be applied to the gate 216 by a wordline 220 in an effort to form a conduction channel between the source and the drain regions as done with addressing and reading conventional DRAM cells.

However, now in its programmed state, the conduction channel 206 of the floating gate transistor will have a higher voltage threshold and will not conduct.

Figure 2C:
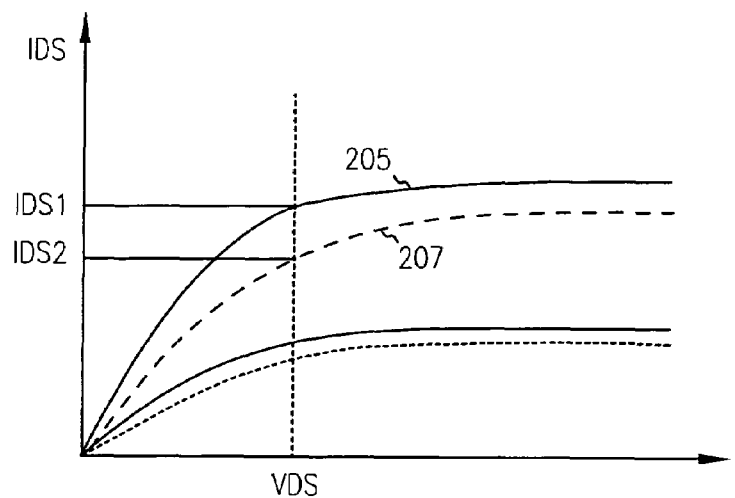
FIG. 2C is a graph plotting the current signal (Ids) detected at the drain region versus a voltage potential, or drain voltage, (VDS) set up between the drain region and the source region (Ids vs. VDS).

FIG. 2C is a graph plotting a current signal (IDS) detected at the second source/drain region 204 versus a voltage potential, or drain voltage, (VDS) set up between the second source/drain region 204 and the first source/drain region 202 (IDS vs. VDS). In one embodiment, VDS represents the voltage potential set up between the drain region 204 and the source region 202. In FIG. 2C, the curve plotted as 205 represents the conduction behavior of a conventional floating gate transistor where the transistor is not programmed (is normal or not stressed) according to the teachings of the present invention. The curve 207 represents the conduction behavior of the programmed floating gate transistor (stressed), described above in connection with FIG. 2A, according to the teachings of the present invention. As shown in FIG. 2C, for a particular drain voltage, VDS, the current signal (IDS2) detected at the second source/drain region 204 for the programmed floating gate transistor (curve 207) is significantly lower than the current signal (IDS1) detected at the second source/drain region 204 for the conventional floating gate transistor cell (curve 205) which is not programmed according to the teachings of the present invention. Again, this is attributed to the fact that the channel 206 in the programmed floating gate transistor of the present invention has a different voltage threshold.

Some of these effects have recently been described for use in a different device structure, called an NROM, for flash memories. This latter work in Israel and Germany is based on employing charge trapping in a silicon nitride layer in a non-conventional flash memory device structure. Charge trapping in silicon nitride gate insulators was the basic mechanism used in MNOS memory devices, charge trapping in aluminum oxide gates was the mechanism used in MIOS memory devices, and one of the present inventors, along with another, has previously disclosed charge trapping at isolated point defects in gate insulators. However, none of the above described references addressed forming transistor cells utilizing charge trapping in potential wells in oxide insulator nanolaminate layers formed by the different electron affinities of the insulators.

Figure 3:
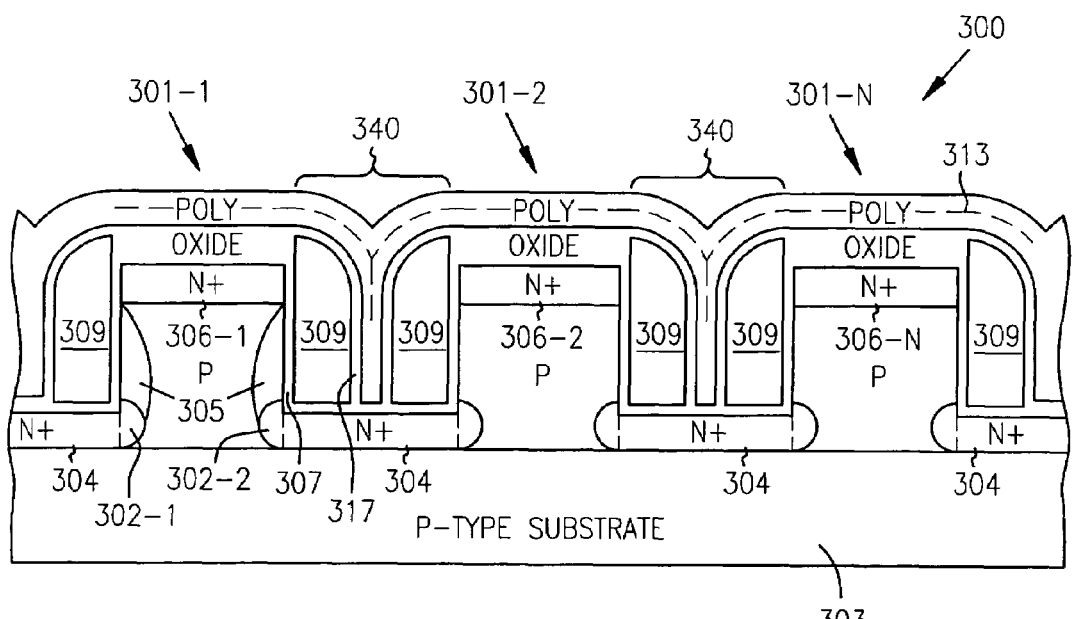
FIG. 3 illustrates a portion of an embodiment of a memory array according to the teachings of the present invention.

FIG. 3 illustrates an embodiment for a portion of a memory array 300 according to the teachings of the present invention. The memory in FIG. 3, is shown illustrating a number of vertical pillars, or floating gate transistor cells, 301-1, 301-2, . . . , 301-N, formed according to the teachings of the present invention. As one of ordinary skill in the art will appreciate upon reading this disclosure, the number of vertical pillar are formed in rows and columns extending outwardly from a substrate 303. As shown in FIG. 3, the number of vertical pillars, 301-1, 301-2, . . . , 301-N, are separated by a number of trenches 340. According to the teachings of the present invention, the number of vertical pillars, 301-1, 301-2, . . . , 301-N, serve as floating gate transistors including a first source/drain region, e.g. 302-1 and 302-2 respectively. The first source/drain region, 302-1 and 302-2, is coupled to a sourceline 304. As shown in FIG. 3, the sourceline 304 is formed in a bottom of the trenches 340 between rows of the vertical pillars, 301-1, 301-2, . . . , 301-N. According to the teachings of the present invention, the sourceline 304 is formed from a doped region implanted in the bottom of the trenches 340. A second source/drain region, e.g. 306-1 and 306-2 respectively, is coupled to a bitline (not shown). A channel region 305 is located between the first and the second source/drain regions.

As shown in FIG. 3, oxide-conductor nanolaminate layers or floating gate, shown generally as 309, are separated from the channel region 305 by a first oxide layer 307 in the trenches 340 along rows of the vertical pillars, 301-1, 301-2, . . . , 301-N. In the embodiment shown in FIG. 3, a wordline 313 is formed across the number of pillars and in the trenches 340 between the oxide-conductor nanolaminate layers 309. The wordline 313 is separated from the pillars and the oxide-conductor nanolaminate layers 309, or floating gate 309, by a second oxide layer 317. Here the wordline 313 serves as a control gate 313 for each pillar.

Figure 4:
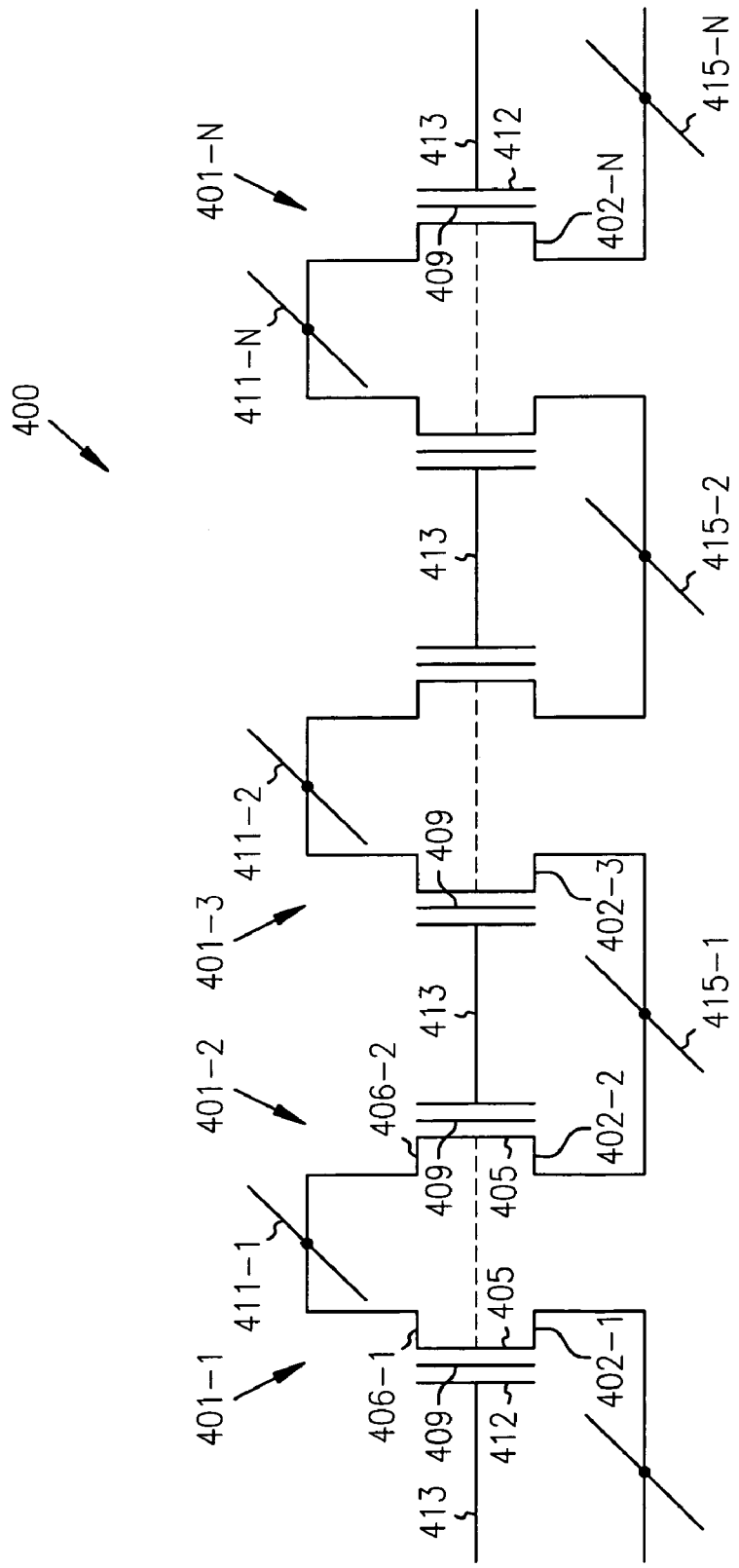
FIG. 4 illustrates an embodiment for an electrical equivalent circuit for the portion of the memory array shown in FIG. 3.

FIG. 4 illustrates an electrical equivalent circuit 400 for the portion of the memory array shown in FIG. 3. As shown in FIG. 4, a number of vertical floating gate transistor cells, 401-1, 401-2, . . . , 401-N, are provided. Each vertical floating gate transistor cell, 401-1, 401-2, . . . , 401-N, includes a first source/drain region, e.g. 402-1 and 402-2, a second source/drain region, e.g. 406-1 and 406-2, a channel region 405 between the first and the second source/drain regions, and oxide-conductor nanolaminate layers serving as a floating gate, shown generally as 409, separated from the channel region by a first oxide layer.

FIG. 4 further illustrates a number of bit lines, e.g. 411-1 and 411-2. According to the teachings of the present invention as shown in the embodiment of FIG. 4, a single bit line, e.g. 411-1 is coupled to the second source/drain regions, e.g. 406-1 and 406-2, for a pair of floating gate transistor cells 401-1 and 401-2 since, as shown in FIG. 3, each pillar contains two floating gate transistor cells. As shown in FIG. 4, the number of bit lines, 411-1 and 411-2, are coupled to the second source/drain regions, e.g. 406-1 and 406-2, along rows of the memory array. A number of word lines, such as wordline 413 in FIG. 4, are coupled to a control gate 412 of each floating gate transistor cell along columns of the memory array. According to the teachings of the present invention, a number of sourcelines, 415-1, 415-2, . . . , 415-N, are formed in a bottom of the trenches between rows of the vertical pillars, described in connection with FIG. 3, such that first source/drain regions, e.g. 402-2 and 402-3, in column adjacent floating gate transistor cells, e.g. 401-2 and 401-3, separated by a trench, share a common sourceline, e.g. 415-1. And additionally, the number of sourcelines, 415-1, 415-2, . . . , 415-N, are shared by column adjacent floating gate transistor cells, e.g. 401-2 and 401-3, separated by a trench, along rows of the memory array 400. In this manner, by way of example and not by way of limitation referring to column adjacent floating gate transistor cells, e.g. 401-2 and 401-3, separated by a trench, when one column adjacent floating gate transistor cell, e.g. 401-2, is being read its complement column adjacent floating gate transistor cell, e.g. 401-3, can operate as a reference cell.

Figure 5:
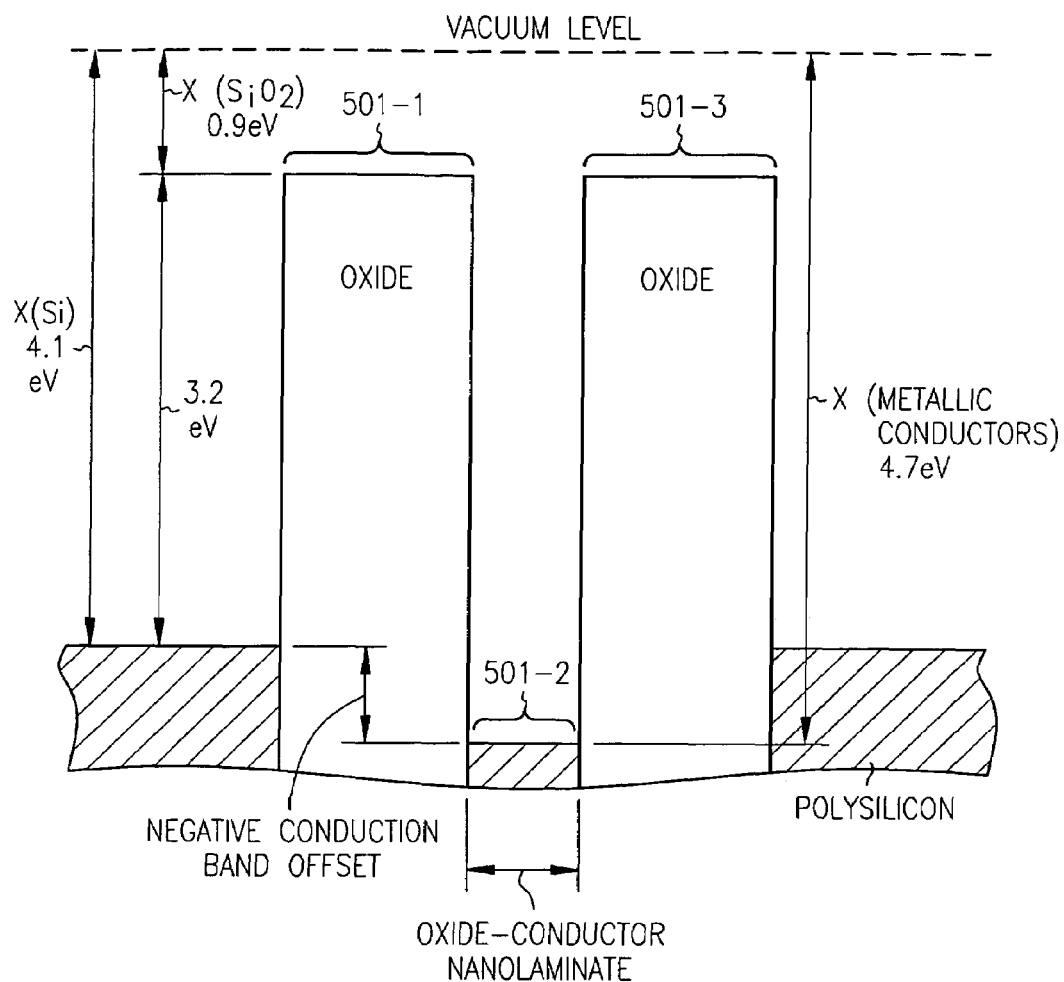
FIG. 5 illustrates an energy band diagram for an embodiment of a gate stack according to the teachings of the present invention.

FIG. 5 illustrates an energy band diagram for an embodiment of a gate stack according to the teachings of the present invention. As shown in FIG. 5, the embodiment consists of insulator stacks, 501-1, oxide-conductor nanolaminate 501-2 and insulator stacks 501-3, e.g. $SiO_2$/oxide-conductor nanolaminate layers/$SiO_2$. The structure shown in FIG. 5 illustrates the present invention's use in various embodiments of metallic conductors, doped oxide conductors, and metals as a nanolaminate between two layers of silicon oxide.

Tantalum nitride, titanium nitride, and tungsten nitride are mid-gap work function metallic conductors described for use in CMOS devices. Tantalum nitride, titanium nitride, and tungsten nitride are employed in the present invention as oxide-conductor nanolaminate layers, formed by atomic layer deposition (ALD). These metallic conductors have large electron affinities around 4.7 eV which is larger than the 4.1 ev electron affinity of silicon oxide.

Figure 6:
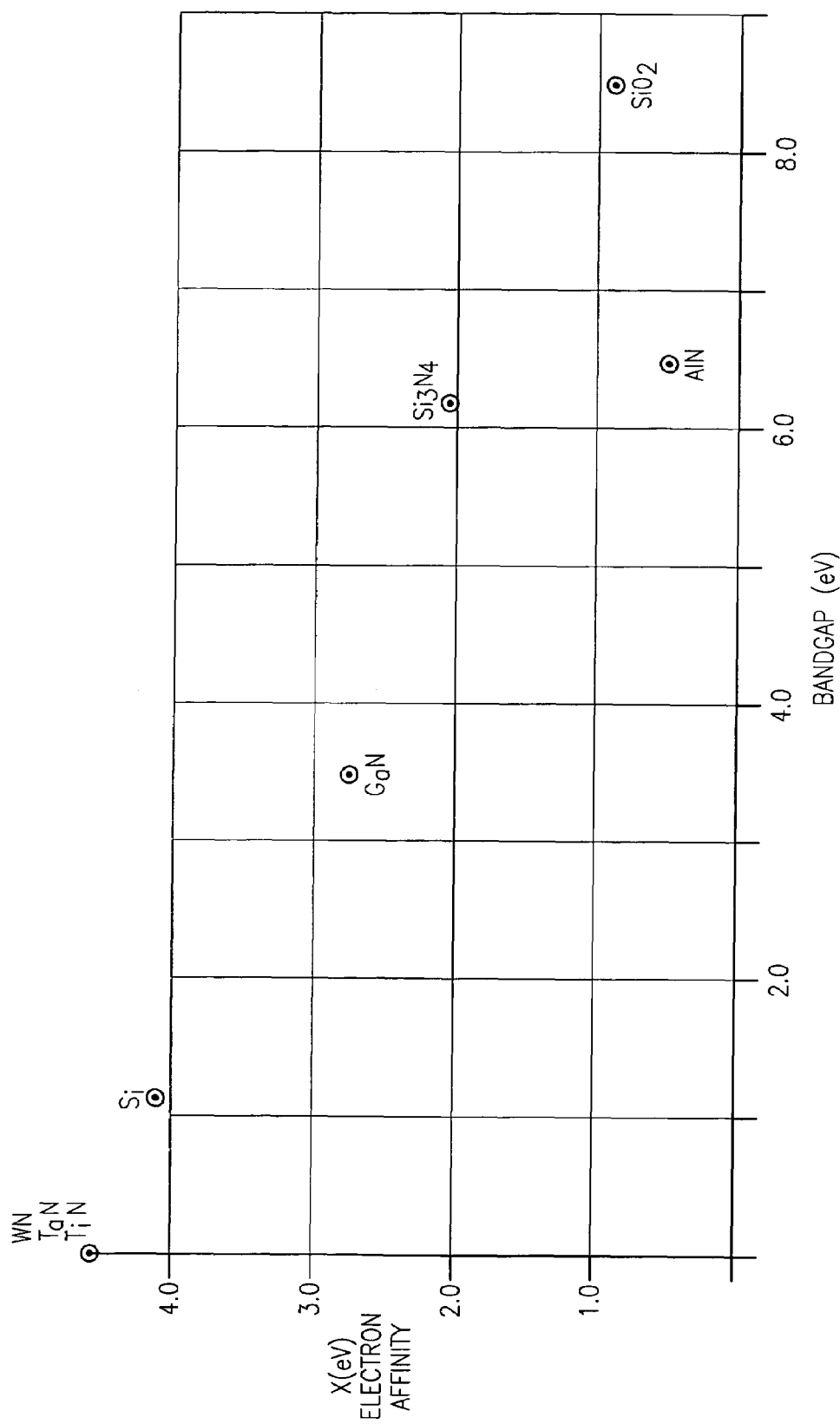
FIG. 6 is a graph which plots electron affinity versus the energy bandgap for various insulators.

In some embodiments according to the teachings of the present invention, atomic layer deposition, ALD, of a number of other conductors is used to form the nanolaminate structures. As described in more detail below, the oxide-conductor nanolaminate layers used in the present invention include:

(i) Metallic Conductors, TaN, TiN, WN, NbN, MoN (ii) Doped Oxide Conductors, ZnOS (iii) Metals, including tungsten, W, and Nickel, Ni As mentioned above, Titanium nitride, tantalum nitride and tungsten nitride are mid-gap work function metallic conductors, with no or zero band gaps and large electron affinities as shown in FIG. 6, commonly described for use in CMOS devices.

Method of Formation

This disclosure describes the use of oxide-conductor nanolaminate layers as floating gates to trap charge in potential wells formed by the different electron affinities of the insulator layers. These layers formed by ALD are of atomic dimensions, or nanolaminates, with precisely controlled interfaces and layer thickness. Operation of the device specifically depends on and utilizes the electron affinity of the oxide-conductor nanolaminate layers being higher than that of silicon oxide. This creates a potential energy well in the multi-layer nanolaminate gate insulator structure.

Atomic Layer Deposition of Metallic Conductors

TaN: Plasma-enhanced atomic layer deposition (PEALD) of tantalum nitride (Ta—N) thin films at a deposition temperature of 260° C. using hydrogen radicals as a reducing agent for Tertbutylimidotris(diethylamido)tantalum has been described. The PEALD yielded superior Ta—N films with an electric resistivity of 400 µΩcm and no aging effect under exposure to air. The film density is higher than that of Ta—N films formed by typical ALD, in which $NH_3$ is used instead of hydrogen radicals. In addition, the as-deposited films are not amorphous, but rather polycrystalline structure of cubit TaN. The density and crystallinity of the films increased with the pulse time of hydrogen plasma. The films are Ta-rich in composition and contain around 15 atomic % of carbon impurity. In the PEALD of Ta—N films, hydrogen radicals are used a reducing agent instead of $NH_3$, which is used as a reactant gas in typical Ta—N ALD. Films are deposited on $SiO_2$ (100 nm)/Si wafers at a deposition temperature of 260° C. and a deposition pressure of 133 Pa in a cold-walled reactor using $(Net_2)_3$ Ta=Nbu$^t$ [tertbutylimidotris(diethylamido)tantalum, TBTDET] as a precursor of Ta. The liquid precursor is contained in a bubbler heated at 70° C. and carried by 35 sccm argon. One deposition cycle consist of an exposure to a metallorganic precursor of TBTDET, a purge period with Ar, and an exposure to hydrogen plasma, followed by another purge period with Ar. The Ar purge period of 15 seconds instead between each reactant gas pulse isolates the reactant gases from each other. To ignite and maintain the hydrogen plasma synchronized with the deposition cycle, a rectangular shaped electrical power is applied between the upper and lower electrode. The showerhead for uniform distribution of the reactant gases in the reactor, capacitively coupled with an rf (13.56 MHz) plasma source operated at a power of 100 W, is used, as the upper electrode. The lower electrode, on which a wafer resides, is grounded. Film thickness and morphology are analyzed by field emission scanning electron microscopy.

TiN: Atomic layer deposition (ALD) of amorphous TiN films on SiO2 between 170° C. and 210° C. has been achieved by the alternate supply of reactant sources, Ti[N(C2H5CH3)2]4 [tetrakis(ethylmethylamino)titanium:TEMAT] and NH3. These reactant sources are injected into the reactor in the following order: TEMAT vapor pulse, Ar gas pulse, NH3 gas pulse and Ar gas pulse. Film thickness per cycle saturated at around 1.6 monolayers per cycle with sufficient pulse times of reactant sources at 200° C. The results suggest that film thickness per cycle could exceed 1 ML/cycle in ALD, and are explained by the rechemisorption mechanism of the reactant sources. An ideal linear relationship between number of cycles and film thickness has been confirmed.

TiN and TaN: Deposition of thin and conformal copper films of has been examined using atomic layer deposition, ALD, of TiN and TaN as possible seed layer for subsequent electrodeposition. The copper films are deposited on glass as well as Ta, TIN, and TaN films on Si wafers. Typical resistivities of these films range from 4.25 µΩcm for 20 nm thick copper films to 1.78 µΩcm for 120 nm thick films. The adhesion of the copper films deposited on TiN and TaN at 300° C. is excellent. These films are highly conformal over high aspect ratio trenches.

TiN, $TaN_x$, NbN, and $MoN_x$: Atomic layer deposition of Tin, $TaN_x$, NbN, and $MoN_x$ thin films from the corresponding metal chlorides and 1,1-dimethyl-hydrazine (DMHy) have been studied. Generally, the same films deposited at 400° C. exhibit better characteristics compared to the films deposited at the same temperature using $NH_3$ as the nitrogen source. In addition, films can be deposited at lower temperatures down to 200° C. Even though the carbon content in the films is quite high, in the range of 10 atom %, the results encourage further studies. The effect of carbon on the barrier properties and the use of other possibly less carbon-contaminating hydrazine derivatives can be considered.

WN: Tungsten nitride films have been deposited with atomic layer control using sequential surface reactions. The tungsten nitride film growth is accomplished by separating the binary reaction $2WF_6+NH_3 \rightarrow W_2N+3HF+9/2F_2$ into two half-reactions. Successive application of the $WF_6$ and $NH_3$ half-reactions in an ABAB . . . sequence produce tungsten nitride deposition at substrate temperatures between 600 and 800 K. Transmission Fourier transform infrared (FTIR) spectroscopy has been used to monitor the coverage of $WF_x^*$ and $NH_y^*$ surface species on high surface area particles during the $WF_6$ and $NH_3$ half-reactions. The FTIR spectroscope results demonstrate the $WF_6$ and $NH_3$ half-reactions are complete and self-limiting at temperatures>600 K. In situ spectroscopic ellipsometry has been used to monitor the film growth on Si(100) substrate vs. temperature and reactant exposure. A tungsten nitride deposition rate of 2.55 Å/AB cycle is measured at 600-800 K for $WF_6$ and $NH_3$ reactant exposure>3000 L and 10,000 L, respectively. X-ray photoelectron spectroscopy depth-profiling experiments have been used to determine that the films had a $W_2N$ stoichiometry with low C and O impurity concentrations. X-ray diffraction investigations reveal that the tungsten nitride films are microcrystalline. Atomic force microscopy measurements of the deposited films illustrate remarkably flat surface indicating smooth film growth. These smooth tungsten nitride films deposited with atomic layer have been be used as diffusion control for Cu on contact and via holes.

Atomic Layer Deposition of Doped Oxide Conductors

ZnO:

ZnO can be deposited by ALD. The aim of previous experiments is to improve the performance of Cd-free ZnO/Cu (InGa)Se$_2$ solar cells using a high-resistivity ZnO buffer layer. Buffer layers are deposited by atomic layer deposition (ALD) using diethylzinc (DEZn) and $H_2O$ as reactant gases. The structural and electrical properties of the ZnO films on glass substrates have been characterized. A high resistivity of more than $10^3$ Ωcm and a transmittance of above 80% in the visible range were obtained. Suticai Chaitsak et al. focused on determining the optimum deposition parameters for the ALD-ZnO buffer layer. Results indicate that the thickness and resistivity of the ALD-ZnO buffer layer, as well as the heat treatment prior to the deposition of the buffer layer, affect the device characteristics. The best efficiency obtained with an ALD-ZnO buffer layer of solar cells without an antireflective coating is 12.1%. The reversible light soaking effect is observed in these devices. ZoO itself however is highly resistive, doping ZnO as described below is required to make it conductive and useful here.

ZnOS: The chemical vapor atomic layer deposition technique is used to deposit thin films of $ZnO_{1-x}S_x$ on glass and silicon substrates. Film composition is varied from x=0 to x=0.95, and measurements of bandgap and resistivity yielded surprising minima at x~0.6. Results of Rutherford backscattering, X-ray, and luminescence measurements are also presented. Both one- and two phase films are visible in scanning electron microcopy, and an amorphous phases is also apparent. A continuously variable mixed film is not observed due to the large lattice mismatch between ZnO and ZnS. Films of $ZnO_{1-x}S_x$ are deposited using dimethylzinc, 1% hydrogen sulfide in nitrogen, and the trace oxygen and/or water present (up to 2 ppm) in ultrahigh-purity (UHP) nitrogen. The dimethyzinc is contained in a stainless steel cylinder equipped with a dip tube. To lower the dimethylzinc vapor pressure, the cylinder is held at 273 K using an ice water bath. Prepurified nitrogen served as a carrier gas for the dimethylzinc. Gas pressure are given in the table below:

| | |
|---|---|
| Nitrogen flush pressure | 50 psig |
| Dimethylzinc cylinder pressure | 50 psig |
| Hydrogen sulfide cylinder pressure | 30, 50, or 70 psig |
| Dimethylzinc reaction time | 2 s |
| Hydrogen sulfide reaction time | 5 s |
| Nitrogen purge times | 11 s at a standard flow rate of 1 L/mm |
| Delay to allow nitrogen back-0 8 s pressure to drop | |

The electrical resistivity, mobility, and carrier concentration results from Hall measurements on some samples are given in the following table:

| X in $ZnO_{1-x}S_x$ | Resistivity, $\Omega$ cm | Donor concentration, $cm^{-3}$ | Mobility, $cm^2/V\,s$ |
|---|---|---|---|
| 0 | 0.0048 | $4.8 \times 10^{19}$ | 13.2 |
| 0.25 | 0.101 | $1.7 \times 10^{18}$ | 36.1 |
| 0.56 | 0.042 | $1.66 \times 10^{19}$ | 32.2 |
| 0.66 | 1.28 | $2.0 \times 10^{17}$ | 24 |
| 0.82 | 8.27 | $2.4 \times 10^{16}$ | 28 |
| 0.92 | 67.9 | $2.61 \times 10^{15}$ | 94 |

Atomic Layer Deposition of Metal Films

W: The atomic layer deposition (ALD) of tungsten (W) films has been demonstrated using alternate exposure of tungsten hexafluoride ($WF_6$) and disilane ($Si_2H_6$). The present investigation explored the kinetics of the $WF_6$ and $Si_2H_6$ surface reactions during W ALD at 303-623 K using Auger electron spectroscopy technique. The reaction of $WF_6$ with the $Si_2H_6$-saturated W surface proceeded to completion at 373-573 Kelvin (K). The $WF_6$ reaction displayed a reactive sticking coefficient of S=0.4 and required an exposure of 30 L (1 L=$1*10^{-6}$ Torr s) to achieve saturation at 573 K. The $WF_6$ exposures necessary to reach saturation increased with decreasing temperature. At surface temperatures<373 K, the $WF_6$ reaction did not consume all the silicon (Si) surface species remaining from the previous $Si_2H_6$ exposure. The reaction of $Si_2H_6$ with the $WF_6$-saturated W surface displayed three kinetic regimes. In the first region at slow $Si_2H_6$ exposures< or =50 L, the $Si_2H_6$ reaction is independent of temperature and had a reactive striking coefficient of S~$5*10^{-2}$. In the second kinetic region at intermediate $Si_2H_6$ exposure of 50-300 L, the $Si_2H_6$ reaction showed an apparent saturation behavior with Si thickness at saturation at increased at substrate temperature. At high $Si_2H_6$ exposures of 300-$1*10^5$/L, additional Si is deposited with an approximately logarithmic dependence on $Si_2H_6$ exposure. The $Si_2H_6$ reaction in this third kinetic region had an activation energy E=2.6 kcal/mol and the Si thickness deposited by a $1.6*10^5$ L $Si_2H_6$ exposure increased with temperature from 3.0 Å at 303 K to 6.6 Å at 623 K. These kinetic results should help to explain W ALD growth rates observed at different exposures and substrate temperatures.

Ni: A thin film of elementary nickel is formed by atomic layer deposition (ALD). The deposition cycle consisted of two consecutive chemical reaction steps: an oxidizing step and a reducing step. An atomic layer of nickel oxide is made by sequentially supplying bis(cyclopentadienyl)-nickel as a nickel precursor and water as an oxidation agent; the preformed atomic layer of nickel oxide is then reduced to elementary nickel metal by exposure to hydrogen radical at a deposition temperature of 165° C. Auger electron spectroscopy analysis detected negligible oxygen content in the grown films, indicating that the hydrogen radical had completely reduced the nickel oxide to metallic film films. In addition, carbon impurities in the film dropped from 16 atomic % to less than 5 atomic % during the reaction. The proposed two-stage ALD method for elementary metal is successful in forming continuous and conformal nickel films. The nickel films formed an effective glue layer between chemical vapor deposited copper and diffusion barrier layer of TiN. The addition of a 1 μm thick copper film to a 15 nm thick nickel glue layer over a TiN barrier film is excellent, with no failures occurring during adhesive tape peel tests.

Memory Devices

This disclosure describes a flash memory device, programmable logic array device or memory address and decode correction device with a conductor nanolaminate floating gate rather than a conventional polysilicon floating gate. In some embodiments according to the teachings of the present invention, the gate insulator structure shown in FIG. 5 is employed in a wide variety of different flash memory type devices. That is, in embodiments of the present invention, the gate structure embodiment of FIG. 5, having silicon oxide-conductor-silicon oxide-nanolaminates, is used in place of the gate structure provided in the following commonly assigned patents: U.S. Pat. Nos. 5,936,274; 6,143,636; 5,973,356; 6,238,976; 5,991,225; 6,153,468; and 6,124,729.

In embodiments of the present invention, the gate structure embodiment of FIG. 5, having silicon oxide-conductor silicon oxide-nanolaminates, is used in place of the gate structure provided in the following commonly assigned pending applications: Forbes, L., "Write Once Read Only Memory Employing Charge Trapping in Gate Insulators," application Ser. No. 10/177,077; Forbes, L., "Write Once Read Only Memory Employing Floating Gates," application Ser. No. 10/177,083; Forbes, L., "Write Once Read Only Memory With Large Work Function Floating Gates," application Ser. No. 10/177,213; Forbes, L., "Nanocrystal Write Once Read Only Memory For Archival Storage," application Ser. No. 10/177,214; Forbes, L., "Ferroelectric Write Once Read Only Memory For Archival Storage," application Ser. No. 10/177,082; Forbes, L., "Vertical NROM Having a Storage Density of 1 Bit Per $1F^2$," application Ser. No. 10/177,208; Forbes, L., "Multistate NROM Having a Storage Density Much Greater Than 1 Bit Per $1F^2$," application Ser. No. 10/177,211; and Forbes, L., "NOR Flash Memory Cell With High Storage Density," application Ser. No. 10/177,483.

According to the teachings of the present invention, embodiments of the novel floating gate transistor herein, which are substituted for the gate structures described in the references above, are programmed by grounding a source line and applying a gate voltage and a voltage to the drain to cause channel hot electron injection. To read the memory state, the drain and ground or source have the normal connections and the conductivity of the floating gate transistor determined using low voltages so as not to disturb the memory state. The devices can be erased by applying a large negative voltage to the gate.

In embodiments of the present invention, the gate structure embodiment of FIG. 5, having silicon oxide-conductor-silicon oxide-nanolaminates, is used in place of the gate structure provided in the following commonly assigned patents: U.S. Pat. Nos. 5,936,274, 6,143,636, 5,973,356 and 6,238,976 (vertical flash memory devices with high density); U.S. Pat. Nos. 5,991,225 and 6,153,468 (programmable memory address and decode circuits); and U.S. Pat. No. 6,124,729 (programmable logic arrays).

Further, in embodiments of the present invention, the gate structure embodiment of FIG. 5, having silicon oxide-metal oxide-silicon oxide-conductor nanolaminates, is used in place of the gate structure provided in the following: Eitan, B. et al., "NROM: A novel localized Trapping, 2-Bit Nonvolatile Memory Cell," *IEEE Electron Device Lett.*, 21(11), 543-545 (November 2000); Eitan, B. et al., "Characterization of Channel Hot Electron Injection by the Subthreshold Slope of NROM device," *IEEE Electron Device Lett.*, 22(11), 556-558 (November 2001); Maayan, E. et al., "A 512 Mb NROM Flash Data Storage Memory with 8 MB/s Data Rate," Dig. IEEE Int. Solid-State Circuits Conf., 100-101 (2002). In these embodiments, the gate structure embodiment of FIG. 5, having silicon oxide-metal oxide-silicon oxide-conductor nanolaminates used in place of the gate structures in those references, can be programmed in the reverse direction and read in the forward direction to obtain more sensitivity in the device characteristics to the stored charge.

All of the above references are incorporated herein in full. The gate structure embodiment of FIG. 5, having silicon oxide-conductor-silicon oxide-nanolaminates, are herein used in place of the gate structure provided in those references to support the various embodiments of the present invention. That is, the present invention incorporates the multitude of device structures described in those references to create a multitude of new embodiments which utilize electron trapping in potential wells formed by the floating gate oxide-conductor nanolaminate structure shown in FIG. 5, rather than employing other floating gates, as recited in many of the above references. In an embodiment, a floating gate transistor array includes a number of floating gate transistor cells extending from a substrate, where the number of floating gate transistor cells operate as equivalent to a floating gate transistor having a size equal to or less than 2.0 lithographic feature squared ($2F^2$). In an embodiment, an electronic system includes a number of floating gate transistors, where each floating gate transistor operates as equivalent to a floating gate transistor having a size equal to or less than 2.0 lithographic feature squared ($2F^2$).

Sample Operation

Figure 7A:
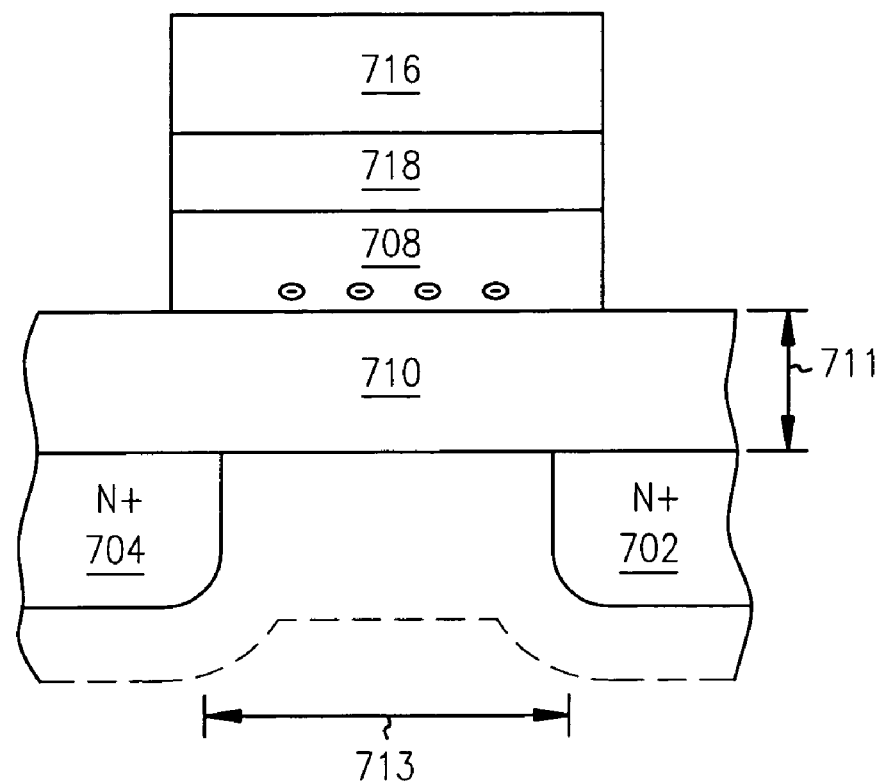
FIGS. 7A-7B illustrates an embodiment for the operation of a floating gate transistor cell having oxide-conductor nanolaminate layers according to the teachings of the present invention.
Figure 7B:
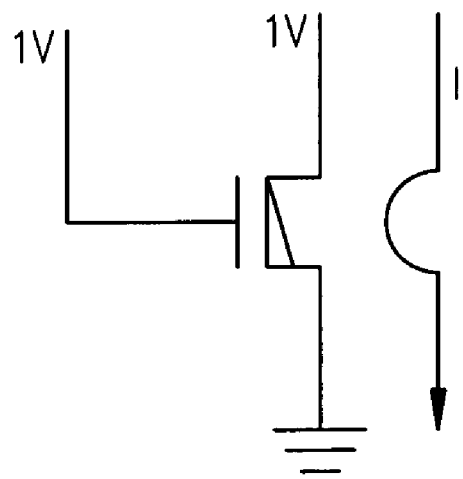
Figure 8:
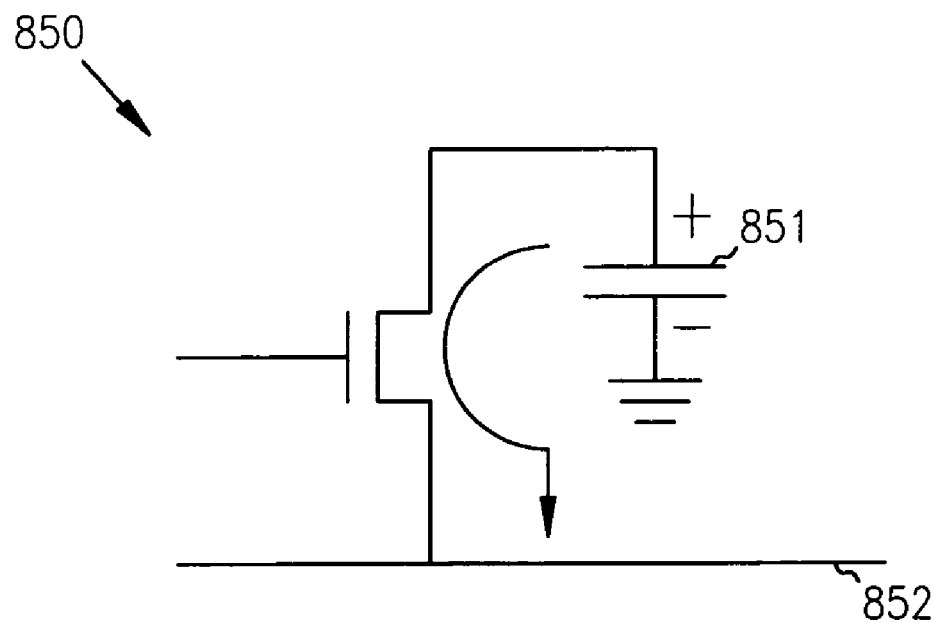
FIG. 8 illustrates the operation of a conventional DRAM cell.

FIGS. 7A-B and 8 are embodiments useful in illustrating the use of charge storage in the oxide-conductor nanolaminate layers to modulate the conductivity of the floating gate transistor cell according to the teachings of the present invention. That is, FIGS. 7A-7B illustrates the operation of an embodiment for a novel floating gate transistor cell 701 formed according to the teachings of the present invention. And, FIG. 8 illustrates the operation of a conventional DRAM cell 701. As shown in FIG. 7A, the embodiment consists of a gate insulator stack having insulator layers, 710, 708 and 718, e.g. $SiO_2$/oxide-conductor nanolaminate layers/$SiO_2$. In the embodiment of FIG. 7A, the gate insulator stack having insulator layers, 710, 708 and 718, has a thickness 711 thicker than in a conventional DRAM cell, e.g. 801 and is equal to or greater than 10 nm or 100 Å ($10^{-6}$ cm). In the embodiment shown in FIG. 7A a floating gate transistor cell has dimensions 713 of 0.1 μm ($10^{-5}$ cm) by 0.1 μm. The capacitance, Ci, of the structure depends on the dielectric constant, $\in_i$, and the thickness of the insulating layers, t. In an embodiment, the dielectric constant is $0.3 \times 10^{-12}$ F/cm and the thickness of the insulating layer is $10^{-6}$ cm such that Ci=$\in_i$/t, Farads/cm$^2$ or $3 \times 10^{-7}$ F/cm$^2$. In one embodiment, a charge of $10^{12}$ electrons/cm$^2$ is programmed into the oxide-conductor nanolaminate layers of the floating gate transistor cell. Here the charge carriers become trapped in potential wells in the oxide-conductor nanolaminate layers 708 formed by the different electron affinities of the insulators 710, 708 and 718, as shown in FIG. 7A. This produces a stored charge $\Delta Q = 10^{12}$ electrons/cm$^2 \times 1.6 \times 10^{-19}$ Coulombs. In this embodiment, the resulting change in the threshold voltage ($\Delta$Vt) of the floating gate transistor cell will be approximately 0.5 Volts ($\Delta$Vt=$\Delta$Q/Ci or $1.6 \times 10^{-7}/3 \times 10^{-7}$=½ Volt). For $\Delta Q = 10^{12}$ electrons/cm$^3$ in an area of $10^{-10}$ cm$^2$, this embodiment of the present invention involves trapping a charge of approximately 100 electrons in the oxide-conductor nanolaminate layers 708 of the floating gate transistor cell. In this embodiment, an original $V_T$ is approximately ½ Volt and the $V_T$ with charge trapping is approximately 1 Volt.

FIG. 7B aids to further illustrate the conduction behavior of the novel floating gate transistor cell of the present invention. As one of ordinary skill in the art will understand upon reading this disclosure, if the floating gate transistor cell is being driven with a control gate voltage of 1.0 Volt (V) and the nominal threshold voltage without the floating gate charged is ½ V, then if the oxide-conductor nanolaminate layers are charged the floating gate transistor cell of the present invention will be off and not conduct. That is, by trapping a charge of approximately 100 electrons in the oxide-conductor nanolaminate layers of the floating gate transistor cell, having dimensions of 0.1 μm ($10^{-5}$ cm) by 0.1 μm, will raise the threshold voltage of the floating gate transistor cell to 1.0 Volt and a 1.0 Volt control gate potential will not be sufficient to turn the device on, e.g. Vt=1.0 V, I=0.

Conversely, if the nominal threshold voltage without the oxide-conductor nanolaminate layers charged is ½ V, then I=$\mu C_{ox} \times$(W/L)$\times$((Vgs-Vt)$^2$/2), or 12.5 μA, with $\mu C_{ox} = \mu C_i = 100$ μA/V$^2$ and W/L=1. That is, the floating gate transistor cell of the present invention, having the dimensions describe above will produce a current I=100 μA/V$^2 \times$(¼)$\times$(½)=12.5 μA. Thus, in the present invention an un-written, or un-programmed floating gate transistor cell can conduct a current of the order 12.5 μA, whereas if the oxide-conductor nanolaminate layers are charged then the floating gate transistor cell will not conduct. As one of ordinary skill in the art will understand upon reading this disclosure, the sense amplifiers used in DRAM arrays, and as describe above, can easily detect such differences in current on the bit lines.

By way of comparison, in a conventional DRAM cell 850 with 30 femtoFarad (fF) storage capacitor 851 charged to 50 femto Coulombs (fC), if these are read over 5 nS then the average current on a bit line 852 is only 10 µA (I=50 fC/5 ns=10 µA). Thus, storing a 50 fC charge on the storage capacitor equates to storing 300,000 electrons (Q=50 fC/($1.6 \times 10^{-19}$)=$30 \times 10^4$=300,000 electrons).

According to the teachings of the present invention, the floating gate transistor cells, having the gate structure with oxide-conductor nanolaminate layers, in the array are utilized not just as passive on or off switches as transfer devices in DRAM arrays but rather as active devices providing gain. In the present invention, to program the floating gate transistor cell "off," requires only a stored charge in the oxide-conductor nanolaminate layers of about 100 electrons if the area is 0.1 µm by 0.1 µm. And, if the floating gate transistor cell is un-programmed, e.g. no stored charge trapped in the oxide-conductor nanolaminate layers, and if the floating gate transistor cell is addressed over 10 nS a current of 12.5 µA is provided. The integrated drain current then has a charge of 125 fC or 800,000 electrons. This is in comparison to the charge on a DRAM capacitor of 50 fC which is only about 300,000 electrons. Hence, the use of floating gate transistor cells, having the gate structure with oxide-conductor nanolaminate layers, in the array as active devices with gain, rather than just switches, provides an amplification of the stored charge, in the oxide-conductor nanolaminate layers, from 100 to 800,000 electrons over a read address period of 10 nS.

Sample Device Applications

Figure 9:
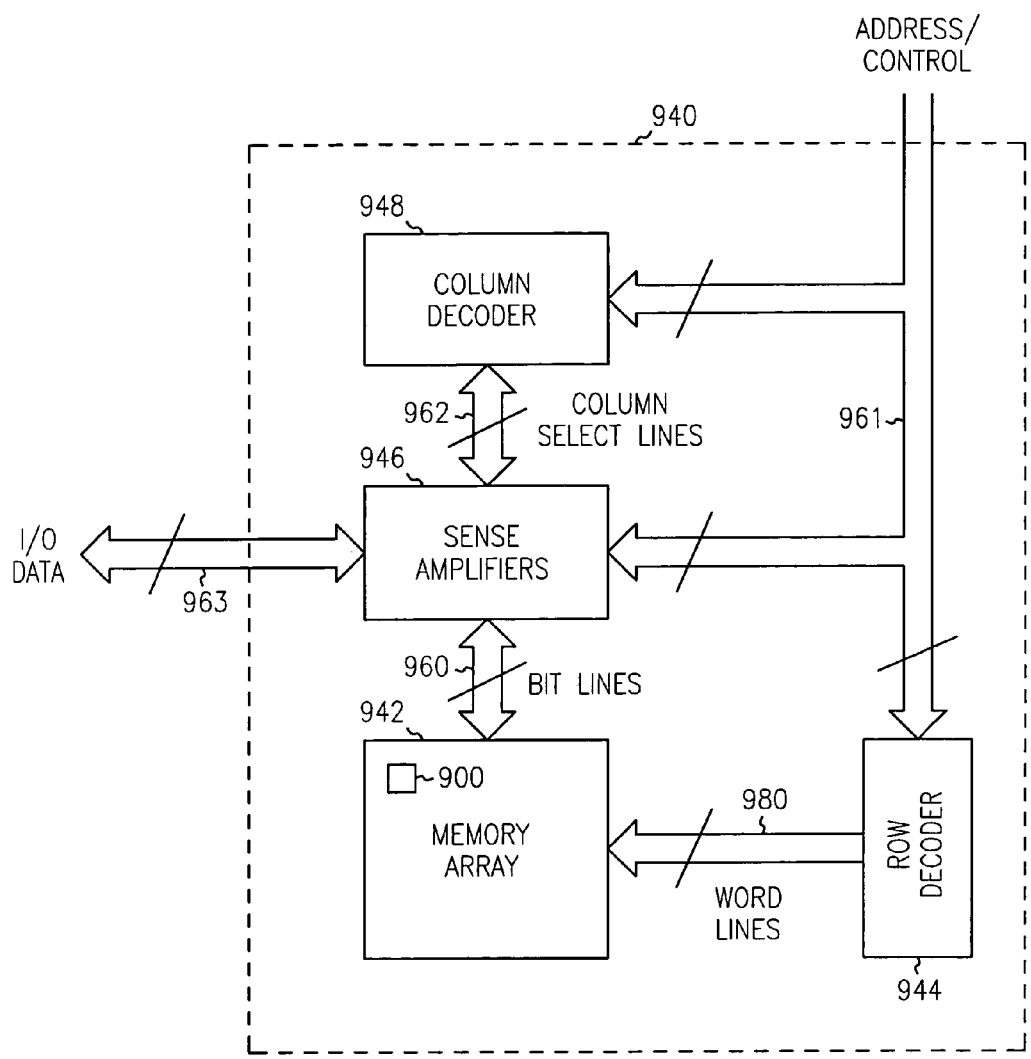
FIG. 9 illustrates an embodiment of a memory device according to the teachings of the present invention.

In FIG. 9 a memory device is illustrated according to the teachings of the present invention. The memory device 940 contains a memory array 942, row and column decoders 944, 948 and a sense amplifier circuit 946. The memory array 942 consists of a plurality of floating gate transistor cells 900, having oxide-conductor nanolaminate layers in the gate stack, whose word lines 980 and bit lines 960 are commonly arranged into rows and columns, respectively. The bit lines 960 of the memory array 942 are connected to the sense amplifier circuit 946, while its word lines 980 are connected to the row decoder 944. Address and control signals are input on address/control lines 961 into the memory device 940 and connected to the column decoder 948, sense amplifier circuit 946 and row decoder 944 and are used to gain read and write access, among other things, to the memory array 942.

The column decoder 948 is connected to the sense amplifier circuit 946 via control and column select signals on column select lines 962. The sense amplifier circuit 946 receives input data destined for the memory array 942 and outputs data read from the memory array 942 over input/output (I/O) data lines 963. Data is read from the cells of the memory array 942 by activating a word line 980 (via the row decoder 944), which couples all of the memory cells corresponding to that word line to respective bit lines 960, which define the columns of the array. One or more bit lines 960 are also activated. When a particular word line 980 and bit lines 960 are activated, the sense amplifier circuit 946 connected to a bit line column detects and amplifies the conduction sensed through a given floating gate transistor cell and transferred to its bit line 960 by measuring the potential difference between the activated bit line 960 and a reference line which may be an inactive bit line. Again, in the read operation the source region of a given cell is couple to a grounded sourceline or array plate (not shown). The operation of Memory device sense amplifiers is described, for example, in U.S. Pat. Nos. 5,627,785; 5,280,205; and 5,042,011, all assigned to Micron Technology Inc., and incorporated by reference herein.

Figure 10:
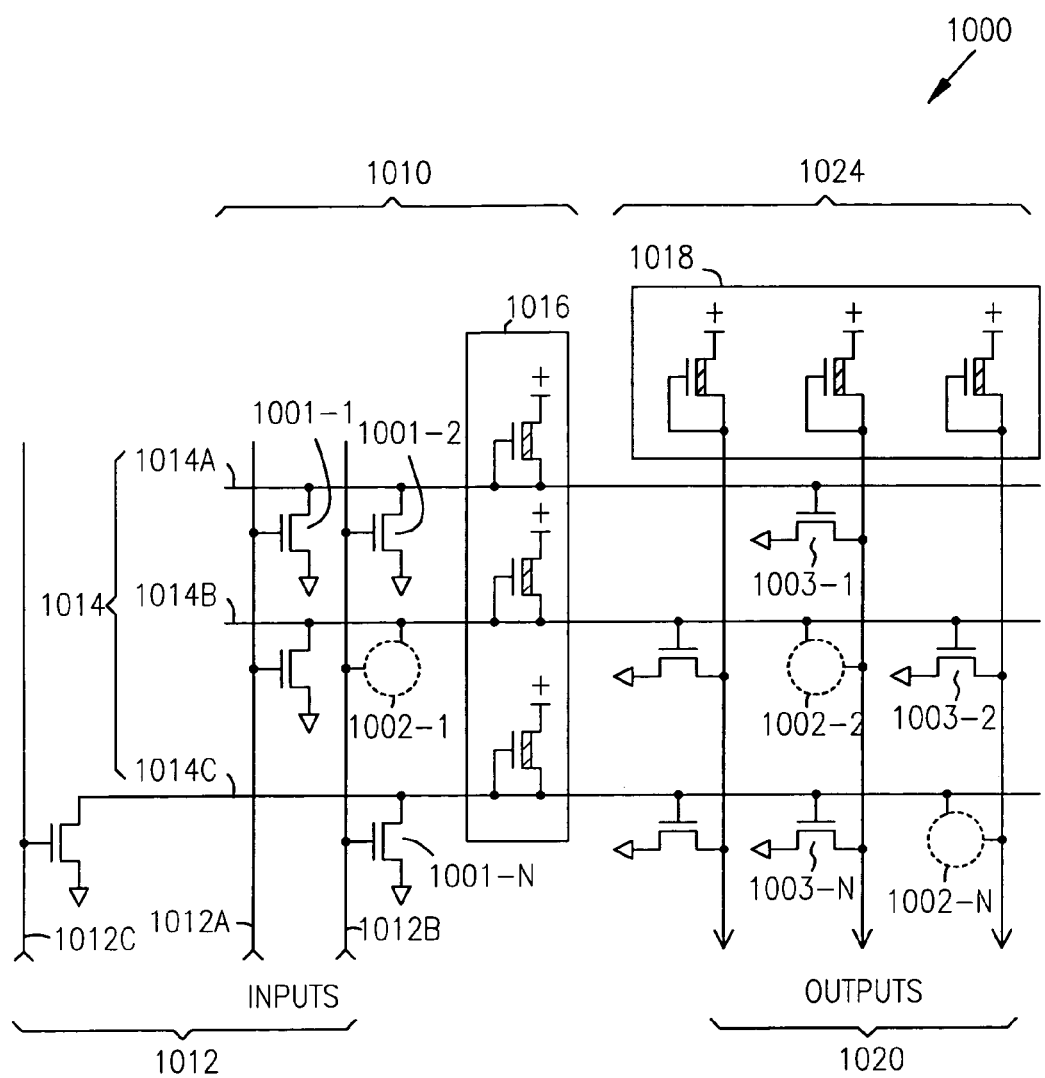
FIG. 10 is a schematic diagram illustrating a conventional NOR-NOR programmable logic array.

FIG. 10 shows a conventional NOR-NOR logic array 1000 which is programmable at the gate mask level by either fabricating a thin oxide gate transistor, e.g. logic cells 1001-1, 1001-2, ..., 1001-N and 1003-1, 1003-2, ... 1003-N, at the intersection of lines in the array or not fabricating a thin oxide gate transistor, e.g. missing thin oxide transistors, 1002-1, 1002-2, ..., 1002-N, at such an intersection. As one of ordinary skill in the art will understand upon reading this disclosure, the same technique is conventionally used to form other types of logic arrays not shown. As shown in FIG. 10, a number of depletion mode NMOS transistors, 1016 and 1018 respectively, are used as load devices.

The conventional logic array shown in FIG. 10 includes a first logic plane 1010 which receives a number of input signals at input lines 1012. In this example, no inverters are provided for generating complements of the input signals. However, first logic plane 1010 can include inverters to produce the complementary signals when needed in a specific application.

First logic plane 1010 includes a number of thin oxide gate transistors, e.g. transistors 1001-1, 1001-2, ..., 1001-N. The thin oxide gate transistors, 1001-1, 1001-2, ..., 1001-N, are located at the intersection of input lines 1012, and interconnect lines 1014. In the conventional PLA of FIG. 10, this selective fabrication of thin oxide gate transistor, e.g. transistors 1001-1, 1001-2, ..., 1001-N, is referred to as programming since the logical function implemented by the programmable logic array is entered into the array by the selective arrangement of the thin oxide gate transistors, or logic cells, 1001-1, 1001-2, ..., 1001-N, at the intersections of input lines 1012, and interconnect lines 1014 in the array.

In this embodiment, each of the interconnect lines 1014 acts as a NOR gate for the input lines 1012 that are connected to the interconnect lines 1014 through the thin oxide gate transistors, 1001-1, 1001-2, ..., 1001-N, of the array. For example, interconnection line 1014A acts as a NOR gate for the signals on input lines 1012A and 1012B. That is, interconnect line 1014A is maintained at a high potential unless one or more of the thin oxide gate transistors, 1001-1, 1001-2, ..., 1001-N, that are coupled to interconnect line 1014A are turned on by a high logic level signal on one of the input lines 1012. When a control gate address is activated, through input lines 1012, each thin oxide gate transistor, e.g. transistors 1001-1, 1001-2, ..., 1001-N, conducts which performs the NOR positive logic circuit function, an inversion of the OR circuit function results from inversion of data onto the interconnect lines 1014 through the thin oxide gate transistors, 1001-1, 1001-2, ..., 1001-N, of the array.

As shown in FIG. 10, a second logic plane 1024 is provided which includes a number of thin oxide gate transistor, e.g. transistors 1003-1, 1003-2, ..., 1003-N. The thin oxide gate transistors, 1003-1, 1003-2, ..., 1003-N, are located at the intersection of interconnect lines 1014, and output lines 1020. Here again, the logical function of the second logic plane 1024 is implemented by the selective arrangement of the thin oxide gate transistors, 1003-1, 1003-2, ..., 1003-N, at the intersections of interconnect lines 1014, and output lines 1020 in the second logic plane 1024. The second logic plane 1024 is also configured such that the output lines 1020 comprise a logical NOR function of the signals from the interconnection lines 1014 that are coupled to particular output lines 1020 through the thin oxide gate transistors, 1003-1, 1003-2, . . . , 1003-N, of the second logic plane 1024. Thus, in FIG. 10, the incoming signals on each line are used to drive the gates of transistors in the NOR logic array as the same is known by one of ordinary skill in the art and will be understood by reading this disclosure.

Figure 11:
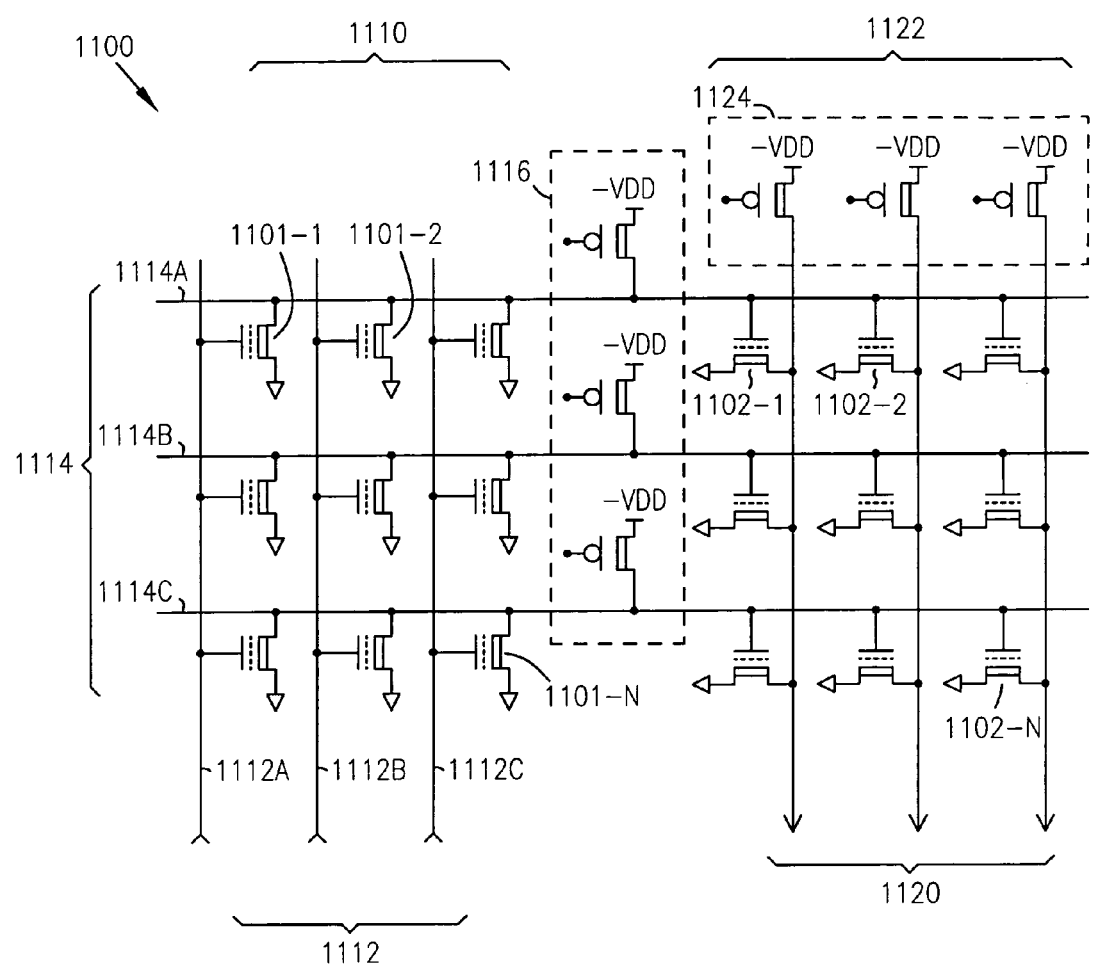
FIG. 11 is a schematic diagram illustrating generally an architecture of one embodiment of a programmable logic array (PLA) with logic cells, having oxide-conductor nanolaminate layers according to the teachings of the present invention.

FIG. 11 illustrates an embodiment of a novel in-service programmable logic array (PLA) formed with logic cells having a floating gate structure with oxide-conductor nanolaminate layers, according to the teachings of the present invention. In FIG. 11, PLA 1100 implements an illustrative logical function using a two level logic approach. Specifically, PLA 1100 includes first and second logic planes 1110 and 1122. In this example, the logic function is implemented using NOR-NOR logic. As shown in FIG. 11, first and second logic planes 1110 and 1122 each include an array of, logic cells, having a gate structure with oxide-conductor nanolaminate layers, which serve as driver floating gate transistors, 1101-1, 1101-2, . . . , 1101-N, and 1102-1, 1102-2, . . . , 1102-N respectively, formed according to the teachings of the present invention. The driver floating gate transistors, 1101-1, 1101-2, . . . , 1101-N, and 1102-1, 1102-2, . . . , 1102-N, have their first source/drain regions coupled to source lines or a conductive source plane. These driver floating gate transistors, 1101-1, 1101-2, . . . , 1101-N, and 1102-1, 1102-2, . . . , 1102-N are configured to implement the logical function of FPLA 1100. The driver floating gate transistors, 1101-1, 1101-2, . . . , 1101-N, and 1102-1, 1102-2, . . . , 1102-N are shown as n-channel floating gate transistors. However, the invention is not so limited. Also, as shown in FIG. 11, a number of p-channel metal oxide semiconductor (PMOS) floating gate transistors are provided as load device floating gate transistors, 1116 and 1124 respectively, having their source regions coupled to a voltage potential (VDD). These load device floating gate transistors, 1116 and 1124 respectively, operate in complement to the driver floating gate transistors, 1101-1, 1101-2, . . . , 1101-N, and 1102-1, 1102-2, . . . , 1102-N to form load inverters.

It is noted that the configuration of FIG. 11 is provided by way of example and not by way of limitation. Specifically, the teachings of the present application are not limited to programmable logic arrays in the NOR-NOR approach. Further, the teachings of the present application are not limited to the specific logical function shown in FIG. 11. Other logical functions can be implemented in a programmable logic array, with the driver floating gate transistors, having a gate structure with oxide-conductor nanolaminate layers, 1101-1, 1101-2, . . . , 1101-N, and 1102-1, 1102-2, . . . , 1102-N and load device floating gate transistors, 1116 and 1124 respectively, of the present invention, using any one of the various two level logic approaches.

First logic plane 1110 receives a number of input signals at input lines 1112. In this example, no inverters are provided for generating complements of the input signals. However, first logic plane 1110 can include inverters to produce the complementary signals when needed in a specific application.

First logic plane 1110 includes a number of driver floating gate transistors, having a gate structure with oxide-conductor nanolaminate layers, 1101-1, 1101-2, . . . , 1101-N, that form an array. The driver floating gate transistors, 1101-1, 1101-2, . . . , 1101-N, are located at the intersection of input lines 1112, and interconnect lines 1114. Not all of the driver floating gate transistors, 1101-1, 1101-2, . . . , 1101-N, are operatively conductive in the first logic plane. Rather, the driver floating gate transistors, 1101-1, 1101-2, . . . , 1101-N, are selectively programmed, as has been described herein, to respond to the input lines 1112 and change the potential of the interconnect lines 1114 so as to implement a desired logic function. This selective interconnection is referred to as programming since the logical function implemented by the programmable logic array is entered into the array by the driver floating gate transistors, 1101-1, 1101-2, . . . , 1101-N, that are used at the intersections of input lines 1112, and interconnect lines 1114 in the array.

In this embodiment, each of the interconnect lines 1114 acts as a NOR gate for the input lines 1112 that are connected to the interconnect lines 1114 through the driver floating gate transistors, 1101-1, 1101-2, . . . , 1101-N, of the array 1100. For example, interconnection line 1114A acts as a NOR gate for the signals on input lines 1112A, 1112B and 1112C. Programmability of the driver floating gate transistors, 1101-1, 1101-2, . . . , 1101-N is achieved by trapping charge carriers in potential wells in the oxide-conductor nanolaminate layers of the gate stack, as described herein. When the oxide-conductor nanolaminate layers are charged, that driver floating gate transistor, 1101-1, 1101-2, . . . , 1101-N will remain in an off state until it is reprogrammed. Applying and removing a charge to the oxide-conductor nanolaminate layers, is performed by tunneling charge into the oxide-conductor nanolaminate layers of the driver floating gate transistors, 1101-1, 1101-2, . . . , 1101-N. A driver floating gate transistors, 1101-1, 1101-2, . . . , 1101-N programmed in an off state remains in that state until the charge is removed from the oxide-conductor nanolaminate layers.

Driver floating gate transistors, 1101-1, 1101-2, . . . , 1101-N not having their corresponding gate structure with oxide-conductor nanolaminate layers charged operate in either an on state or an off state, wherein input signals received by the input lines 1112A, 1112B and 1112C determine the applicable state. If any of the input lines 1112A, 1112B and 1112C are turned on by input signals received by the input lines 1112A, 1112B and 1112C, then a ground is provided to load device floating gate transistors 1116. The load device floating gate transistors 1116 are attached to the interconnect lines 1114. The load device floating gate transistors 1116 provide a low voltage level when any one of the driver floating gate transistors, 1101-1, 1101-2, . . . , 1101-N connected to the corresponding interconnect line 1114 is activated. This performs the NOR logic circuit function, an inversion of the OR circuit function results from inversion of data onto the interconnect lines 1114 through the driver floating gate transistors, 1101-1, 1101-2, . . . , 1101-N of the array 1100. When the driver floating gate transistors, 1101-1, 1101-2, . . . , 1101-N are in an off state, an open is provided to the drain of the load device floating gate transistors 1116. The VDD voltage level is applied to corresponding input lines, e.g. the interconnect lines 1114 for second logic plane 1122 when a load device floating gate transistors 1116 is turned on by a clock signal received at the gate of the load device floating gate transistors 1116. Each of the driver floating gate transistors, 1101-1, 1101-2, . . . , 1101-N described herein are formed according to the teachings of the present, having a gate structure with oxide-conductor nanolaminate layers.

In a similar manner, second logic plane 1122 comprises a second array of driver floating gate transistors, 1102-1, 1102-2, . . . , 1102-N that are selectively programmed to provide the second level of the two level logic needed to implement a specific logical function. In this embodiment, the array of driver floating gate transistors, 1102-1, 1102-2, . . . , 1102-N is also configured such that the output lines 1120 comprise a logical NOR function of the signals from the interconnection lines 1114 that are coupled to particular output lines 1120 through the driver floating gate transistors, 1102-1, 1102-2, . . . , 1102-N of the second logic plane 1122.

Programmability of the driver floating gate transistors, 1102-1, 1102-2, . . . , 1102-N is achieved by trapping charge carriers in potential wells in the oxide-conductor nanolaminate layers of the gate stack, as described herein. When the oxide-conductor nanolaminate layers are charged, that driver floating gate transistor, 1102-1, 1102-2, . . . , 1102-N will remain in an off state until it is reprogrammed. Applying and removing a charge to the oxide-conductor nanolaminate layers are performed by tunneling charge into the oxide-conductor nanolaminate layers of the driver floating gate transistors, 1101-1, 1101-2, . . . , 1101-N. A driver floating gate transistor, e.g. 1102-1, 1102-2, . . . , 1102-N, programmed in an off state remains in that state until the charge is removed from the oxide-conductor nanolaminate layers.

Driver floating gate transistors, 1102-1, 1102-2, . . . , 1102-N not having their corresponding gate structure with oxide-conductor nanolaminate layers charged operate in either an on state or an off state, wherein signals received by the interconnect lines 1114 determine the applicable state. If any of the interconnect lines 1114 are turned on, then a ground is provided to load device floating gate transistors 1124 by applying a ground potential to the source line or conductive source plane coupled to the floating gate transistors first source/drain region as described herein. The load device floating gate transistors 1124 are attached to the output lines 1120. The load device floating gate transistors 1124 provide a low voltage level when any one of the driver floating gate transistors, 1102-1, 1102-2, . . . , 1102-N connected to the corresponding output line is activated. This performs the NOR logic circuit function, an inversion of the OR circuit function results from inversion of data onto the output lines 1120 through the driver floating gate transistors, 1102-1, 1102-2, . . . , 1102-N of the array 1100. When the driver floating gate transistors, 1102-1, 1102-2, . . . , 1102-N are in an off state, an open is provided to the drain of the load device floating gate transistors 1124. The VDD voltage level is applied to corresponding output lines 1120 for second logic plane 1122 when a load device floating gate transistor 1124 is turned on by a clock signal received at the gate of the load device floating gate transistors 1124. In this manner a NOR-NOR electrically programmable logic array is most easily implemented utilizing the normal PLA array structure. Each of the driver floating gate transistors, 1102-1, 1102-2, . . . , 1102-N described herein are formed according to the teachings of the present, having a gate structure with oxide-conductor nanolaminate layers.

Thus FIG. 11 shows an embodiment for the application of the novel floating gate transistor cells, having a gate structure with oxide-conductor nanolaminate layers, in a logic array. If a driver floating gate transistors, 1101-1, 1101-2, . . . , 1101-N, and 1102-1, 1102-2, . . . , 1102-N, is programmed with a negative charge trapped in potential wells, formed with the oxide-conductor nanolaminate layers, it is effectively removed from the array. In this manner the array logic functions can be programmed even when the circuit is in the final circuit or in the field and being used in a system.

The absence or presence of charge trapped in potential wells, formed by the oxide-conductor nanolaminate layers, is read by addressing the input lines 1112 or control gate lines and y-column/sourcelines to form a coincidence in address at a particular logic cell. The control gate line would for instance be driven positive at some voltage of 1.0 Volts and the y-column/sourceline grounded, if the oxide-conductor nanolaminate layers are not charged with electrons then the floating gate transistor would turn on tending to hold the interconnect line on that particular row down indicating the presence of a stored "one" in the cell. If this particular floating gate transistor cell has charge trapped in potential wells, formed by the oxide-conductor nanolaminate layers, the floating gate transistor will not turn on and the presence of a stored "zero" is indicated in the cell. In this manner, data stored on a particular floating gate transistor cell can be read.

Programming can be achieved by hot electron injection. In this case, the interconnect lines, coupled to the second source/drain region for the floating gate transistor cells in the first logic plane, are driven with a higher drain voltage like 2 Volts for 0.1 micron technology and the control gate line is addressed by some nominal voltage in the range of twice this value. Erasure is accomplished by driving the control gate line with a large positive voltage and the sourceline and/or backgate or substrate/well address line of the floating gate transistor with a negative bias so the total voltage difference is in the order of 3 Volts causing electrons to tunnel out of the oxide-conductor nanolaminate layers of the driver floating gate transistors. Writing can be performed, as also described above, by normal channel hot electron injection.

One of ordinary skill in the art will appreciate upon reading this disclosure that a number of different configurations for the spatial relationship, or orientation of the input lines 1112, interconnect lines 1114, and output lines 1120 are possible.

Figure 12:
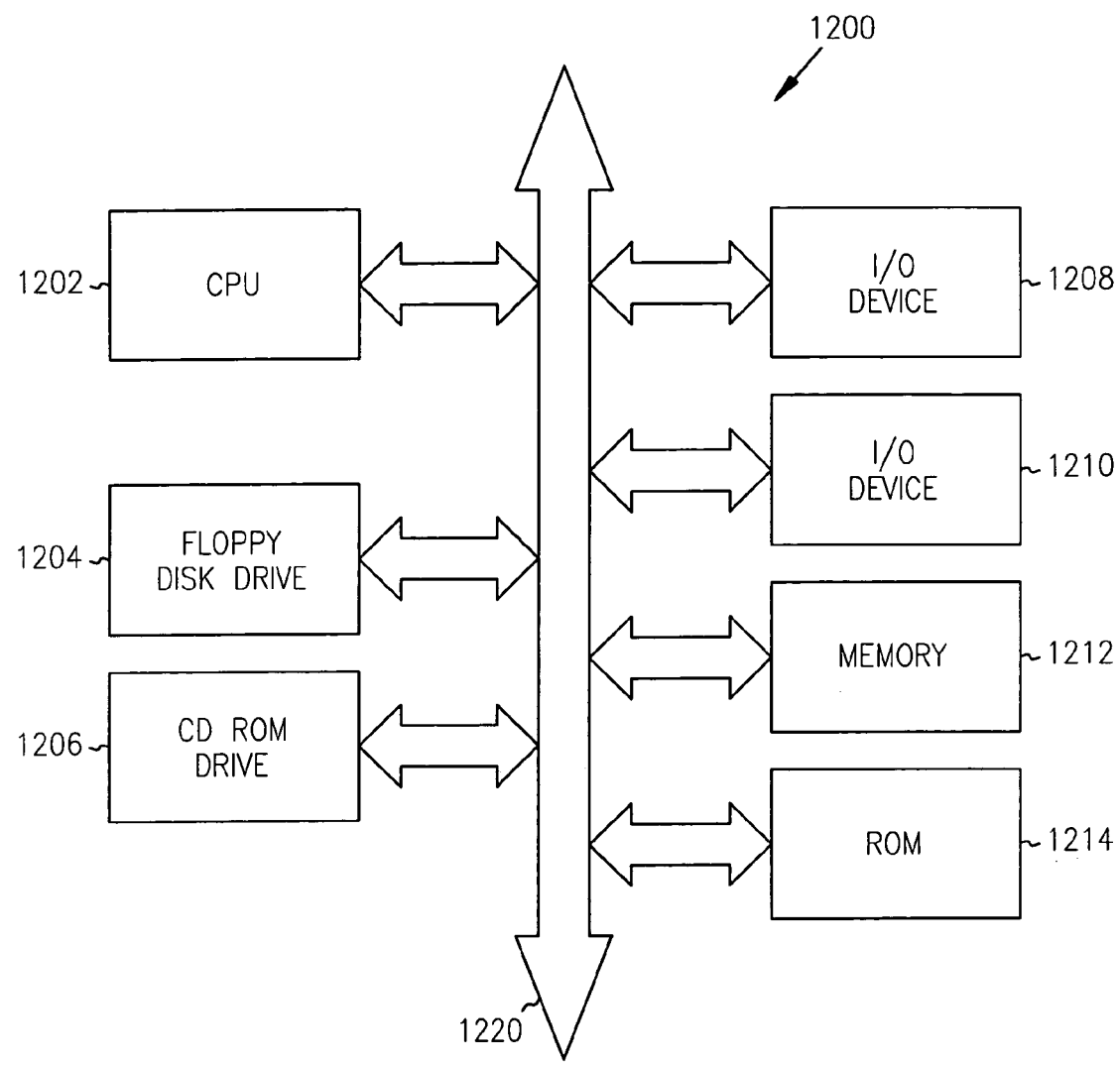
FIG. 12 is a block diagram of an electrical system, or processor-based system, utilizing oxide-conductor nanolaminates constructed in accordance with the present invention.

FIG. 12 is a block diagram of an electrical system, or processor-based system, 1200 utilizing floating gate transistor cells with a gate structure having oxide-conductor nanolaminate layers. By way of example and not by way of limitation, memory 1212 is constructed in accordance with the present invention to have floating gate transistor cells with a gate structure having oxide-conductor nanolaminate layers. The same applies to floating gate transistors in the CPU, etc., the invention is not so limited. The processor-based system 1200 may be a computer system, a process control system or any other system employing a processor and associated memory. The system 1200 includes a central processing unit (CPU) 1202, e.g., a microprocessor, that communicates with the NOR flash memory 1212 and an I/O device 1208 over a bus 1220. It must be noted that the bus 1220 may be a series of buses and bridges commonly used in a processor-based system, but for convenience purposes only, the bus 1220 has been illustrated as a single bus. A second I/O device 1210 is illustrated, but is not necessary to practice the invention. The processor-based system 1200 can also includes read-only memory (ROM) 1214 and may include peripheral devices such as a floppy disk drive 1204 and a compact disk (CD) ROM drive 1206 that also communicates with the CPU 1202 over the bus 1220 as is well known in the art.

It will be appreciated by those skilled in the art that additional circuitry and control signals can be provided, and that the memory device 1200 has been simplified to help focus on the invention. In one embodiment, at least one of the floating gate transistor cells, having a gate structure with oxide-conductor nanolaminate layers in memory 1212 includes a programmed floating gate transistor cell according to the teachings of the present invention.

It will be understood that the embodiment shown in FIG. 12 illustrates an embodiment for electronic system circuitry in which the novel floating gate transistor cells of the present invention are used. The illustration of system 1200, as shown in FIG. 12, is intended to provide a general understanding of one application for the structure and circuitry of the present invention, and is not intended to serve as a complete description of all the elements and features of an electronic system using the novel floating gate transistor cell structures. Further, the invention is equally applicable to any size and type of memory device 1200 using the novel floating gate transistor cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel floating gate transistor cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

This disclosure describes the use of oxide-conductor nanolaminate layers as floating gates to trap charge in potential wells formed by the different electron affinities of the oxide-conductor nanolaminate layers. That is, this disclosure describes a flash memory device, programmable logic array device or memory address and decode correction device with a conductor nanolaminate floating gate rather than a conventional polysilicon floating gate.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for operating a floating gate transistor array, comprising:
    writing to one or more vertical floating gate transistors arranged in rows and columns extending outwardly from a substrate and separated by trenches in a transistor array, wherein each floating gate transistor in the transistor array includes a source region, a drain region, a channel region between the source and the drain regions, a floating gate in the trenches separated from the channel region by a first gate oxide, and a control gate separated from the floating gate by a second gate oxide, wherein a floating gate region includes at least one oxide-conductor nanolaminate layer with at least one layer of a metal conductor formed using atomic layer deposition techniques, wherein the transistor array includes a number of sourcelines formed in a bottom of the trenches between rows of the vertical floating gate transistors and coupled to the source regions of each floating gate transistor along rows of the vertical floating gate transistors, wherein along columns of the vertical floating gate transistors the source region of each column adjacent vertical floating gate transistors couples to the sourceline in a shared trench, and wherein the transistor array includes a number of bitlines coupled to the drain region along rows in the transistor array, and wherein programming the one or more vertical floating gate transistors includes:
        applying a first voltage potential to the drain region of the floating gate transistor;
        applying a second voltage potential to the source region of the floating gate transistor; and
        applying a control gate potential to the control gate of the floating gate transistor.

2. The method of claim 1, wherein applying a first voltage potential to the drain region of the floating gate transistor includes grounding the drain region of the floating gate transistor.

3. The method of claim 2, wherein applying a second voltage potential to the source region includes applying a voltage potential higher than VDD to a sourceline coupled thereto.

4. The method of claim 3, wherein applying a gate potential to the gate of the floating gate transistor includes applying a gate potential to the gate in order to create a conduction channel between the source and drain regions of the floating gate transistor.

5. The method of claim 1, wherein the method further includes reading one or more floating gate transistors, wherein reading the one or more floating gate transistors includes:
    grounding the source region for an addressed floating gate transistor;
    precharging the drain region for the addressed floating gate transistor to a fractional voltage of VDD; and
    applying a gate potential of approximately 1.0 Volt to the control gate for the addressed floating gate transistor such that a conductivity state of the addressed floating gate transistor can be compared to a conductivity state of a reference cell.

6. A method of operating a multistate memory, comprising:
    writing to one or more vertical floating gate transistors arranged in rows and columns extending outwardly from a substrate and separated by trenches in a DRAM array, wherein each floating gate transistor in the DRAM array includes a source region, a drain region, a channel region between the source and the drain regions, a floating gate in the trenches separated from the channel region by a first gate oxide, and a control gate separated from the floating gate by a second gate oxide, wherein a floating gate region includes at least one oxide-conductor nanolaminate layer with at least one layer of a metal conductor formed using atomic layer deposition techniques, wherein the DRAM array includes a number of sourcelines formed in a bottom of the trenches between rows of the vertical floating gate transistors and coupled to the source regions of each floating gate transistor along rows of the vertical floating gate transistors, wherein along columns of the vertical floating gate transistors the source region of each column adjacent vertical floating gate transistors couples to the sourceline in a shared trench, and wherein the DRAM array includes a number of bitlines coupled to the drain region along rows in the DRAM array, and wherein programming the one or more vertical floating gate transistors includes:
        biasing a sourceline for two column adjacent vertical floating gate transistors sharing a trench to a voltage higher than VDD;
        grounding a bitline coupled to one of the drain regions of the two column adjacent vertical floating gate transistors in the vertical floating gate transistors to be programmed;
        applying a gate potential to the control gate for each of the two column adjacent vertical floating gate transistors to create a hot electron injection into the floating gate of the vertical floating gate transistor to be programmed such that an addressed floating gate transistor becomes a programmed floating gate;
    reading one or more vertical floating gate transistors in the DRAM array, wherein reading the one or more floating gate transistors includes:

grounding a sourceline for two column adjacent vertical floating gate transistors sharing a trench;

precharging the drain regions of the two column adjacent vertical floating gate transistors sharing a trench to a fractional voltage of VDD; and applying a gate potential of approximately 1.0 Volt to the control gate for each of the two column adjacent vertical floating gate transistors sharing a trench such that a conductivity state of an addressed vertical floating gate transistor can be compared to a conductivity state of a reference cell.

7. The method of claim 6, wherein reading one or more vertical floating gate transistors in the DRAM array includes using a sense amplifier to detect whether an addressed vertical floating gate transistor is a programmed vertical floating gate transistor, wherein a programmed vertical floating gate transistor will not conduct.

8. The method of claim 6, wherein creating a hot electron injection into the floating gate of an addressed vertical floating gate transistor includes changing a threshold voltage for the vertical floating gate transistor by approximately 0.5 Volts.

9. The method of claim 6, wherein creating a hot electron injection into the floating gate of the addressed vertical floating gate transistor includes trapping a stored charge in the floating gate of the addressed vertical floating gate transistor of approximately $10^{12}$ electrons/cm$^2$.

10. The method of claim 6, wherein creating a hot electron injection into the floating gate of the addressed vertical floating gate transistor includes trapping a stored charge in the gate insulator of the addressed vertical floating gate transistor of approximately 100 electrons.

11. The method of claim 6, wherein the method further includes using the vertical floating gate transistor as an active device with gain, and wherein reading a programmed vertical floating gate transistor includes providing an amplification of a stored charge in the floating gate from approximately 100 to 800,000 electrons over a read address period of approximately 10 ns.

12. A method for operating a floating gate transistor in an array, comprising:

writing to one or more vertical floating gate transistors arranged in rows and columns extending outwardly from a substrate and separated by trenches in a transistor array, wherein each floating gate transistor in the transistor array includes a source region, a drain region, a channel region between the source and the drain regions, a floating gate in the trenches separated from the channel region by a first gate oxide, and a control gate separated from the floating gate by a second gate oxide, wherein a floating gate region includes at least one oxide-conductor nanolaminate layer with at least one layer of a metal conductor formed using atomic layer deposition techniques, wherein the transistor array includes a number of sourcelines formed in a bottom of the trenches between rows of the vertical floating gate transistors and coupled to the source regions of each floating gate transistor along rows of the vertical floating gate transistors, wherein along columns of the vertical floating gate transistors the source region of each column adjacent vertical floating gate transistors couples to the sourceline in a shared trench, and wherein the transistor array includes a number of bitlines coupled to the drain region along rows in the transistor array, and wherein programming the one or more vertical floating gate transistors includes:

applying a first voltage potential to the drain region of the floating gate transistor;

applying a second voltage potential to the source region of the floating gate transistor;

applying a control gate potential to the control gate of the floating gate transistor; and storing a programming charge on the floating gate.

13. The method of claim 12, wherein storing a programming charge on a floating gate that includes a metal conductor nanolaminate layer includes storing a programming charge on a floating gate that includes a Tantalum Nitride (TaN) layer.

14. The method of claim 12, wherein storing a programming charge on a floating gate that includes a metal conductor nanolaminate layer includes storing a programming charge on a floating gate that includes a Titanium Nitride (TiN) layer.

15. The method of claim 12, wherein storing a programming charge on a floating gate that includes a metal conductor nanolaminate layer includes storing a programming charge on a floating gate that includes a Tungsten Nitride (WN) layer.

16. The method of claim 12, wherein storing a programming charge on a floating gate that includes a metal conductor nanolaminate layer includes storing a programming charge on a floating gate that includes a Niobium Nitride (NbN) layer.

17. The method of claim 12, wherein storing a programming charge on a floating gate that includes a metal conductor nanolaminate layer includes storing a programming charge on a floating gate that includes a Molybdenum Nitride (MoN) layer.

18. The method of claim 12, wherein storing a programming charge on a floating gate that includes a metal conductor nanolaminate layer includes storing a programming charge on a floating gate that includes a Zinc-Oxide-Silicon (ZnOS) layer.

19. The method of claim 12, wherein storing a programming charge on a floating gate that includes a metal conductor nanolaminate layer includes storing a programming charge on a floating gate that includes a Tungsten (W) layer.

20. The method of claim 12, wherein storing a programming charge on a floating gate that includes a metal conductor nanolaminate layer includes storing a programming charge on a floating gate that includes a Nickel (Ni) layer.

21. A method for operating a floating gate transistor in an array, comprising:

writing to one or more vertical floating gate transistors arranged in rows and columns extending outwardly from a substrate and separated by trenches in a transistor array, wherein each floating gate transistor in the transistor array includes a source region, a drain region, a channel region between the source and the drain regions, a floating gate in the trenches separated from the channel region by a first gate oxide, and a control gate separated from the floating gate by a second gate oxide, wherein a floating gate region includes at least one oxide-conductor nanolaminate layer with at least one layer of a metal conductor formed using atomic layer deposition techniques, wherein the transistor array includes a number of sourcelines formed in a bottom of the trenches between rows of the vertical floating gate transistors and coupled to the source regions of each floating gate transistor along rows of the vertical floating gate transistors, wherein along columns of the vertical floating gate transistors the source region of each column adjacent vertical floating gate transistors couples to the sourceline in a shared trench, and wherein the transistor array includes a number of bitlines coupled to the drain region along rows in the transistor array, and wherein programming the one or more vertical floating gate transistors includes:

applying a first voltage potential to the drain region of the floating gate transistor;

applying a second voltage potential to the source region of the floating gate transistor;

applying a control gate potential to the control gate of the floating gate transistor;

storing a programming charge on the floating gate; and reading the floating gate transistor.

22. The method of claim 21, wherein storing a programming charge on a floating gate includes storing a charge using hot electron injection by operating the transistor in a first direction.

23. The method of claim 22, wherein reading the floating gate transistor includes operating the transistor in a second direction opposite the first direction.

24. A method for operating an electronic system, comprising:

programming a floating gate transistor in a memory array, including:

writing to one or more vertical floating gate transistors arranged in rows and columns extending outwardly from a substrate and separated by trenches in a transistor array, wherein each floating gate transistor in the transistor array includes a source region, a drain region, a channel region between the source and the drain regions, a floating gate in the trenches separated from the channel region by a first gate oxide, and a control gate separated from the floating gate by a second gate oxide, wherein a floating gate region includes at least one oxide-conductor nanolaminate layer with at least one layer of a metal conductor formed using atomic layer deposition techniques, wherein the transistor array includes a number of sourcelines formed in a bottom of the trenches between rows of the vertical floating gate transistors and coupled to the source regions of each floating gate transistor along rows of the vertical floating gate transistors, wherein along columns of the vertical floating gate transistors the source region of each column adjacent vertical floating gate transistors couples to the sourceline in a shared trench, and wherein the transistor array includes a number of bitlines coupled to the drain region along rows in the transistor array, and wherein programming the one or more vertical floating gate transistors includes:

applying a first voltage potential to the drain region of the floating gate transistor;

applying a second voltage potential to the source region of the floating gate transistor;

applying a control gate potential to the control gate of the floating gate transistor;

storing a programming charge on the floating gate;

reading data from the floating gate transistor; and transmitting the data to a processor within the electronic system.

25. The method of claim 24, wherein storing a programming charge on a floating gate includes storing a charge using hot electron injection by operating the transistor in a first direction.

26. The method of claim 25, wherein reading the floating gate transistor includes operating the transistor in a second direction opposite the first direction.

27. The method of claim 24, wherein applying a first voltage potential to the drain region of the floating gate transistor includes grounding the drain region of the floating gate transistor.

28. The method of claim 24, wherein applying a second voltage potential to the source region includes applying a voltage potential higher than VDD to a sourceline coupled thereto.

* * * * *

UNITED STATES PATENT AND TRADEMARK OFFICE
CERTIFICATE OF CORRECTION

PATENT NO. : 7,583,534 B2  Page 1 of 1
APPLICATION NO. : 11/217771
DATED : September 1, 2009
INVENTOR(S) : Leonard Forbes et al.

It is certified that error appears in the above-identified patent and that said Letters Patent is hereby corrected as shown below:

On The Title Pg. Item (73), line 1, delete "Technolgy," and insert -- Technology, --, therefor.

Signed and Sealed this

Thirteenth Day of October, 2009

David J. Kappos
*Director of the United States Patent and Trademark Office*